United States Patent [19]
Morokawa et al.

[11] 4,016,476
[45] Apr. 5, 1977

[54] BOOSTER CIRCUITS

[75] Inventors: Shigeru Morokawa; Fukuo Sekiya, both of Tokorozawa, Japan

[73] Assignee: Citizen Watch Co., Ltd., Tokyo, Japan

[22] Filed: Nov. 11, 1975

[21] Appl. No.: 630,811

Related U.S. Application Data

[63] Continuation of Ser. No. 397,249, Sept. 14, 1973, abandoned.

[30] Foreign Application Priority Data

| Sept. 20, 1972 | Japan | 47-94393 |
| Sept. 26, 1972 | Japan | 47-95751 |
| Sept. 27, 1972 | Japan | 47-96097 |
| Oct. 5, 1972 | Japan | 47-100157 |

[52] U.S. Cl. .................. 321/15; 307/304
[51] Int. Cl.$^2$ ........................ H02M 7/00
[58] Field of Search .............. 307/304; 321/15

[56] References Cited
UNITED STATES PATENTS

| 3,225,258 | 12/1965 | Brekoo et al. | 321/15 |
| 3,329,247 | 7/1967 | Jaeschke | 321/15 X |
| 3,631,528 | 12/1971 | Green | 307/304 X |
| 3,739,200 | 6/1973 | D'Agostino | 307/304 |

Primary Examiner—William M. Shoop
Attorney, Agent, or Firm—Ernest G. Montague; Karl F. Ross; Herbert Dubno

[57] ABSTRACT

An input line carrying a square-wave voltage is connected through a capacitor to the drain and via an inverter to the gate of a MOSFET acting as a diode, the relative magnitudes of the drain and gate pulses being so chosen that the FET conducts during alternate half-cycles of the square wave whereby the capacitor is charged during nonconductive half-cycles and is fully discharged to the potential of the source of the FET during conductive half-cycles. If the source is biased by a constant voltage, a square wave in a higher voltage range is available at the drain. If the source is connected to potential through another capacitance, a d-c voltage is available at that electrode. Complementary MOSFET/diodes can be connected in push-pull or in cascade to amplify the input voltage; they may also be combined with supplementary voltage boosters including cascaded stages composed of ordinary diodes and capacitors. The MOSFET/diode may be part of an electronic clock drive.

19 Claims, 58 Drawing Figures

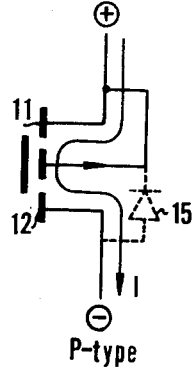
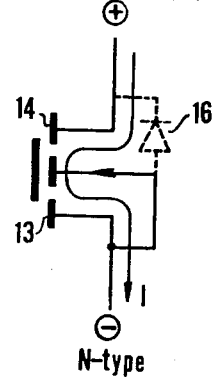
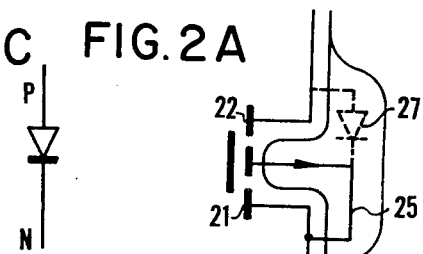
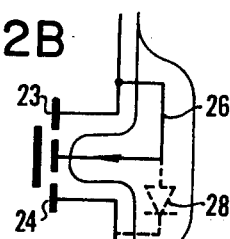
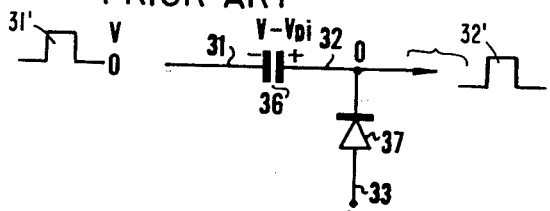
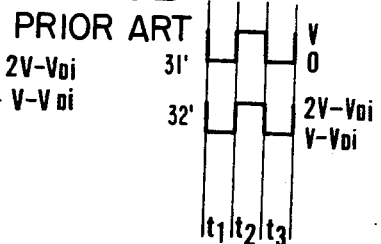
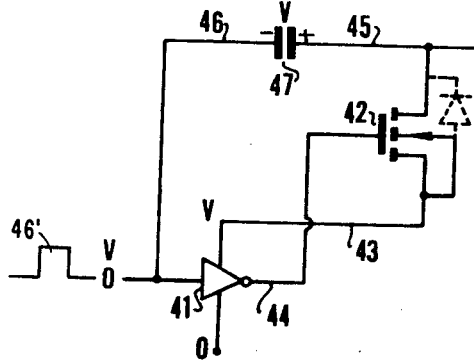
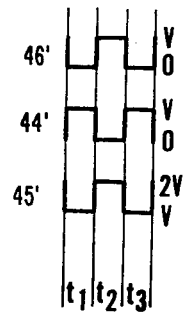

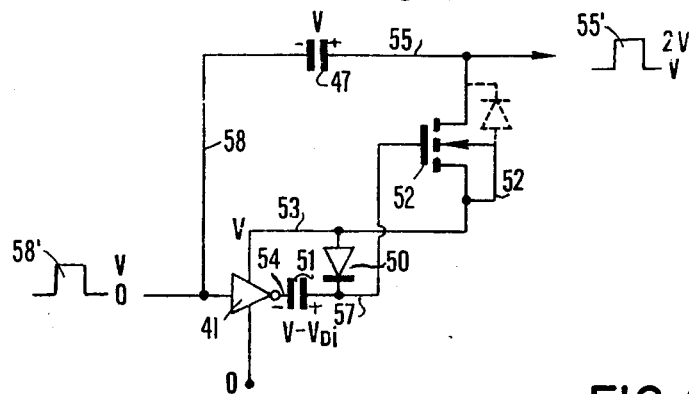 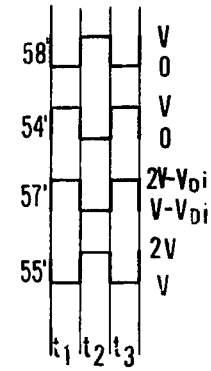
FIG. 5A  FIG. 5B
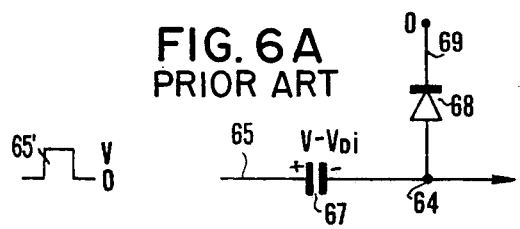 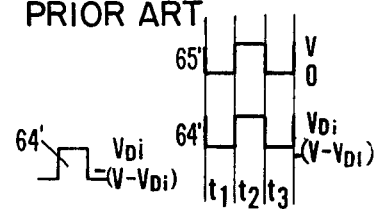
FIG. 6A PRIOR ART  FIG. 6B PRIOR ART
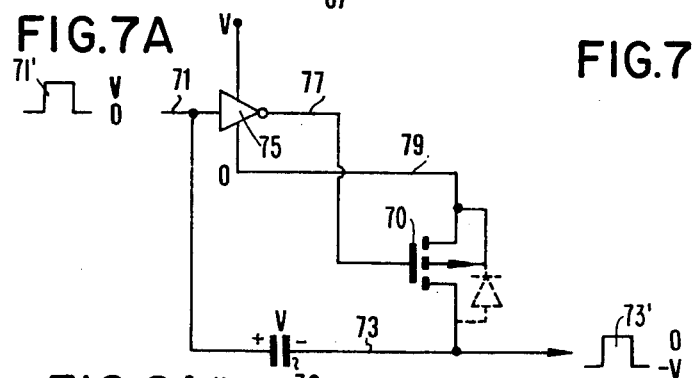 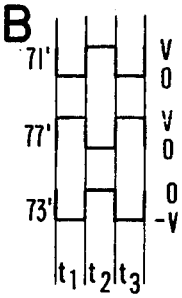
FIG. 7A  FIG. 7B
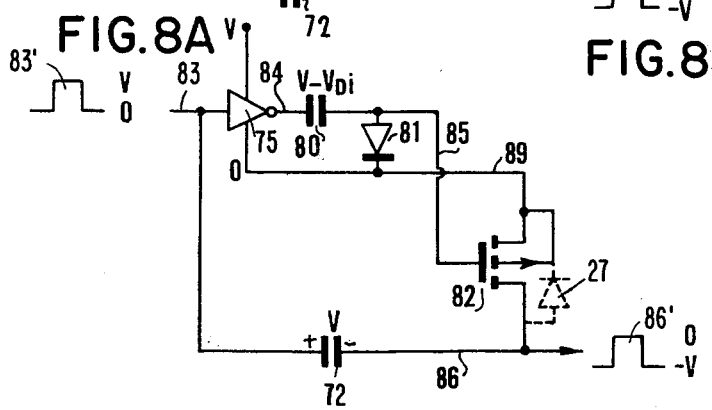 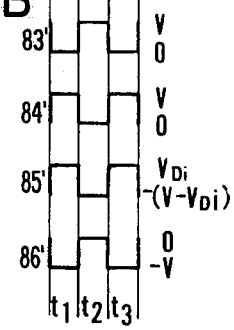
FIG. 8A  FIG. 8B

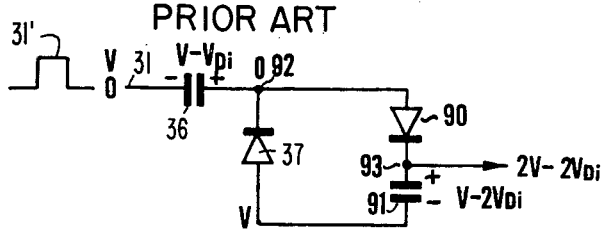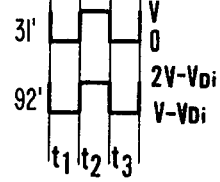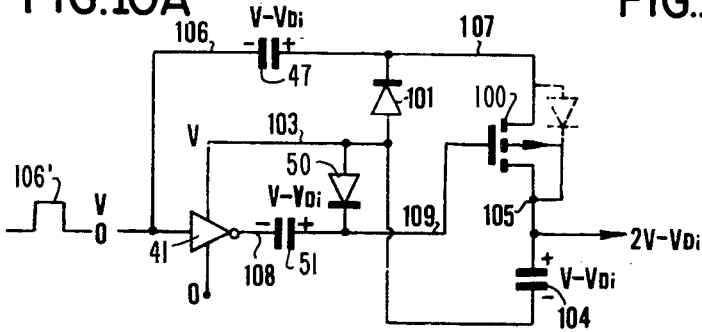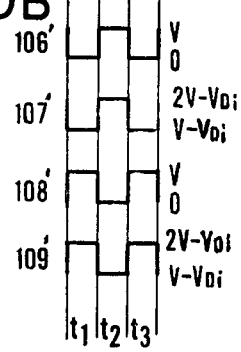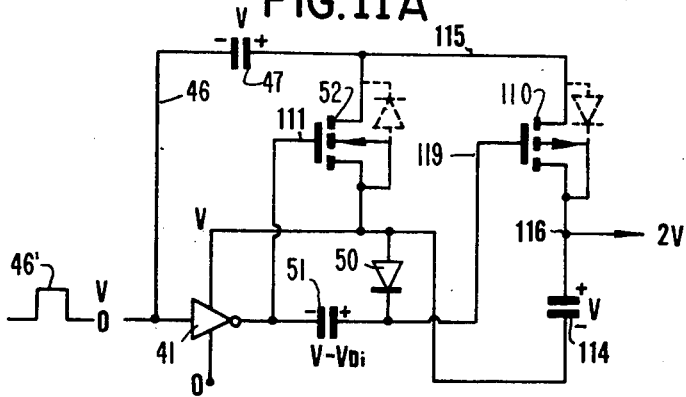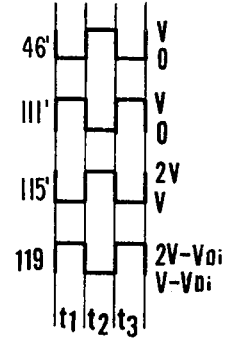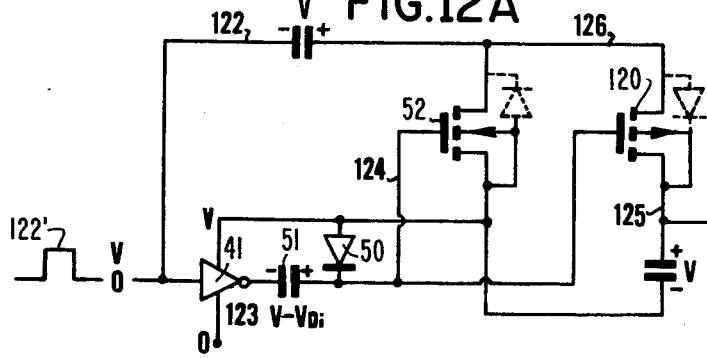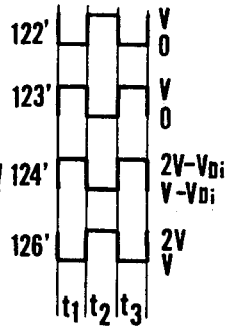

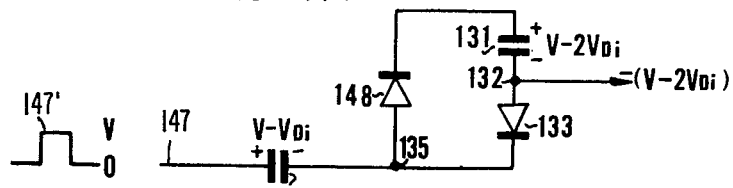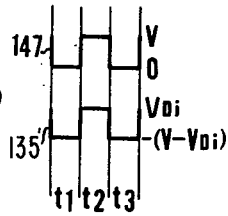
FIG.13A PRIOR ART
FIG.13B PRIOR ART
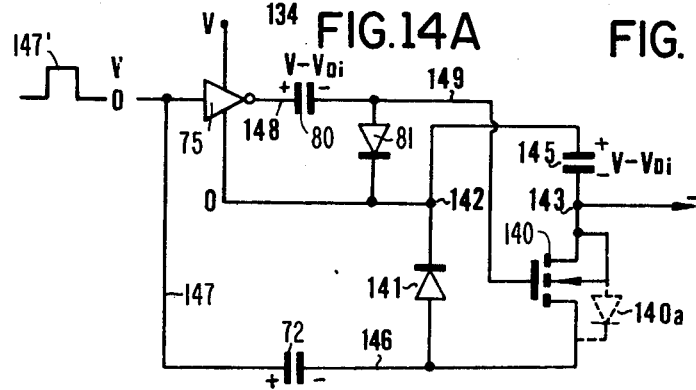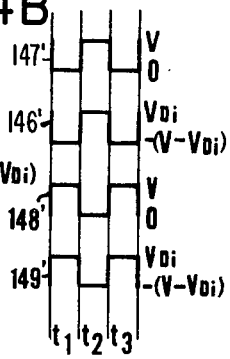
FIG.14A
FIG.14B
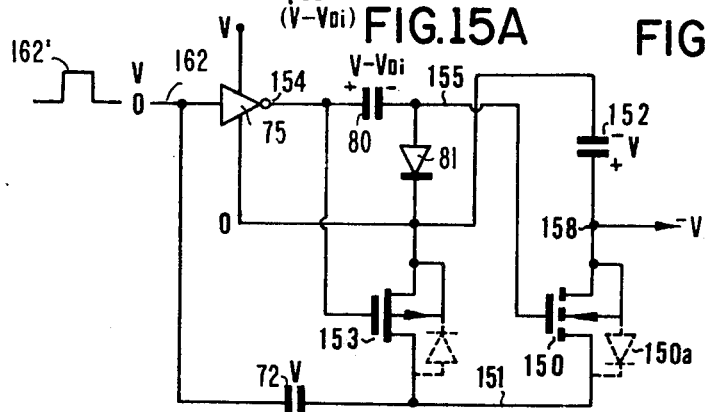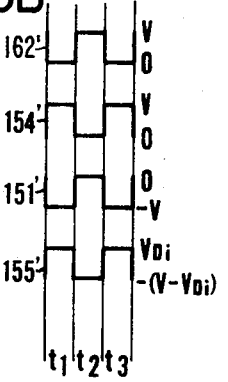
FIG.15A
FIG.15B
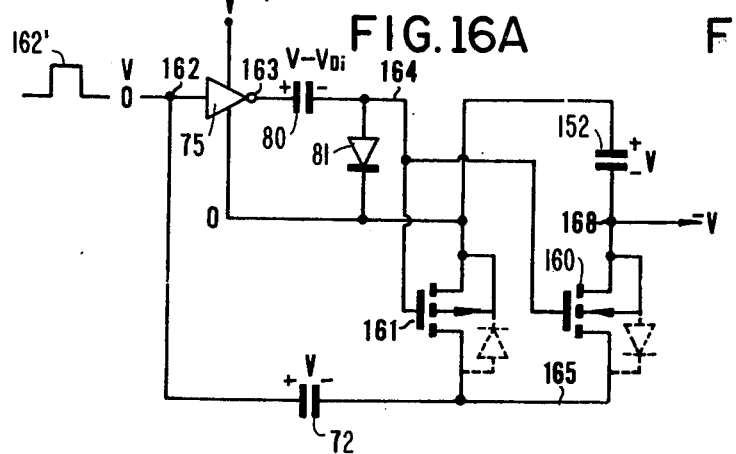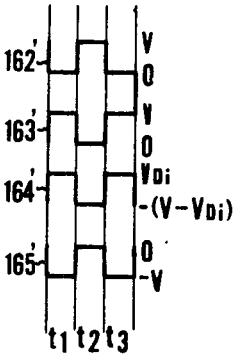
FIG.16A
FIG.16B

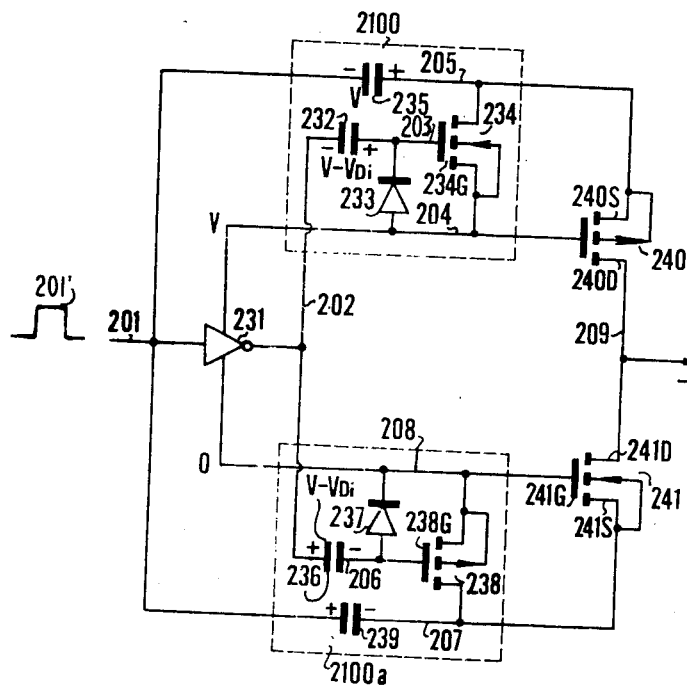
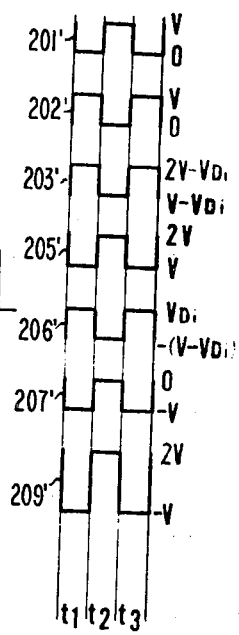
FIG.17A
FIG.17B
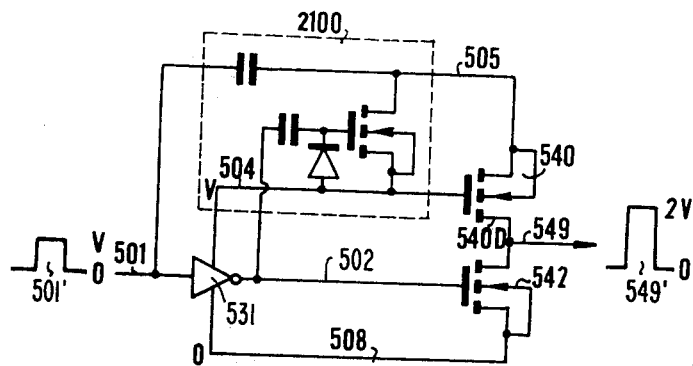
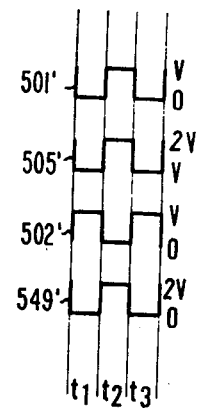
FIG.20A
FIG.20B

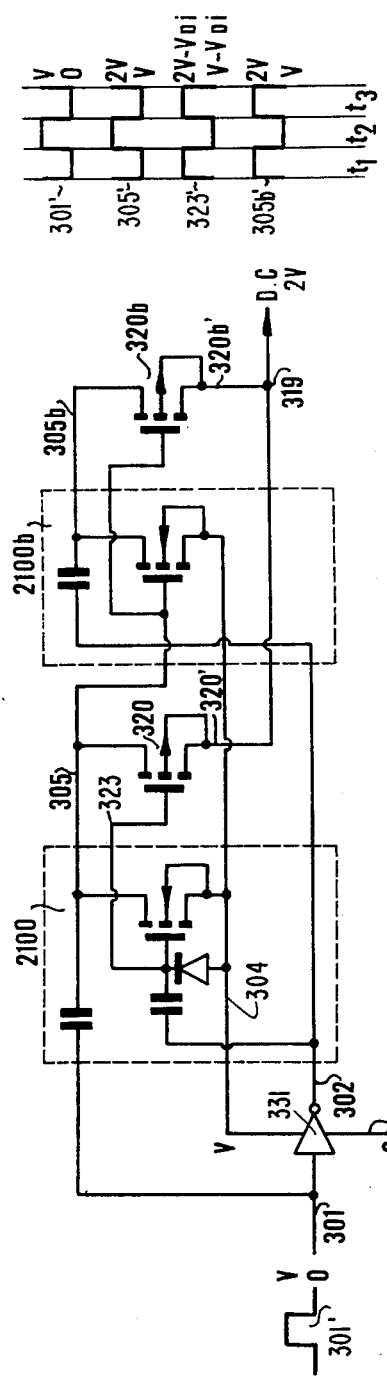
FIG.18A
FIG.18B
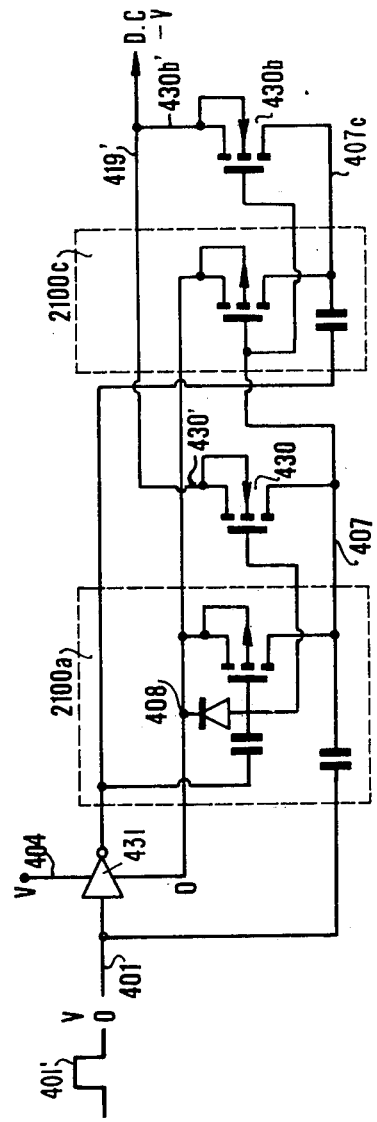
FIG.19

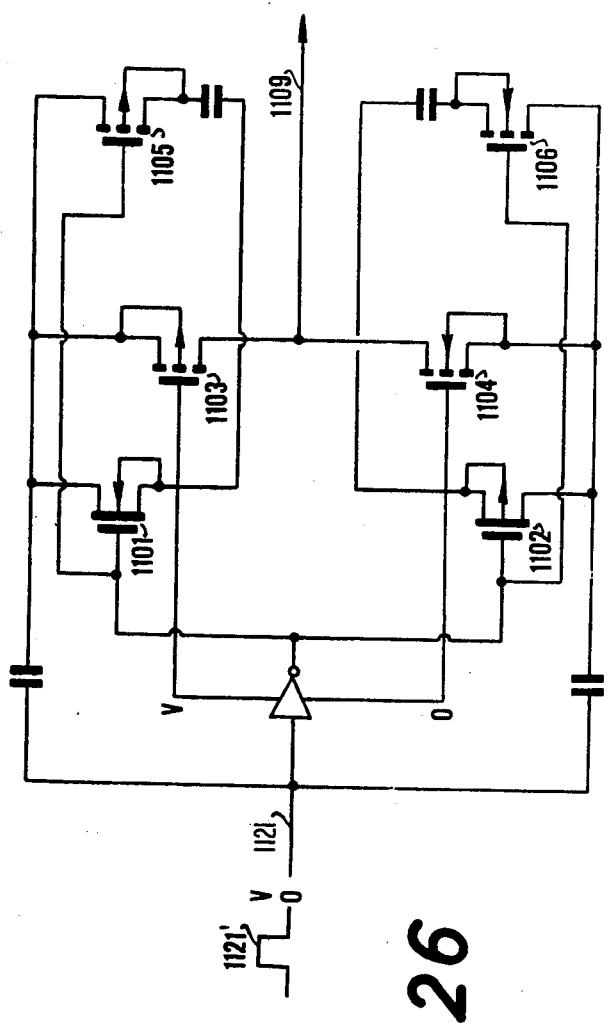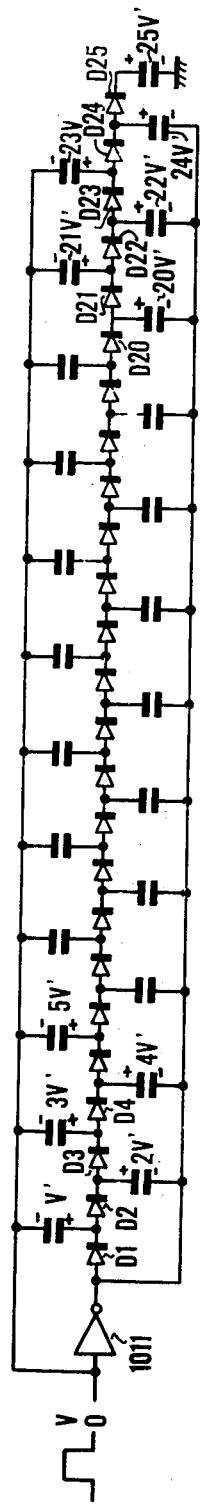
FIG. 26
FIG. 27

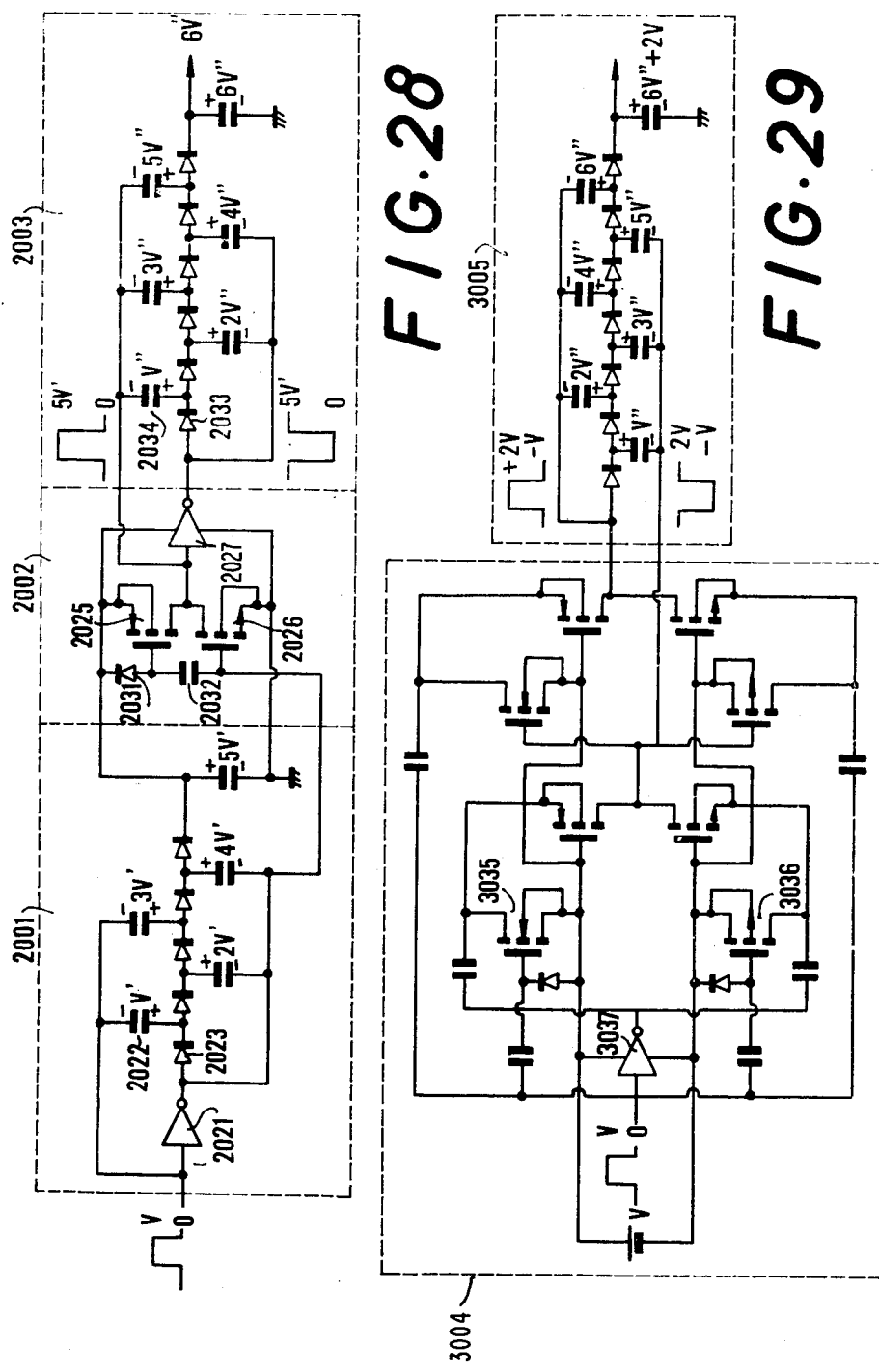

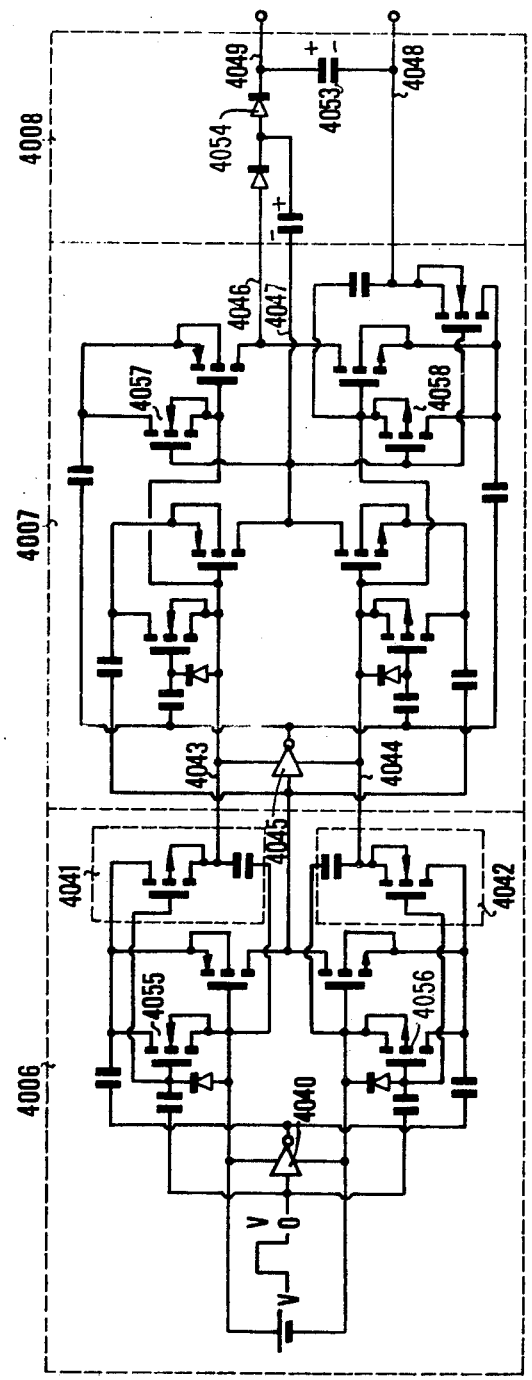
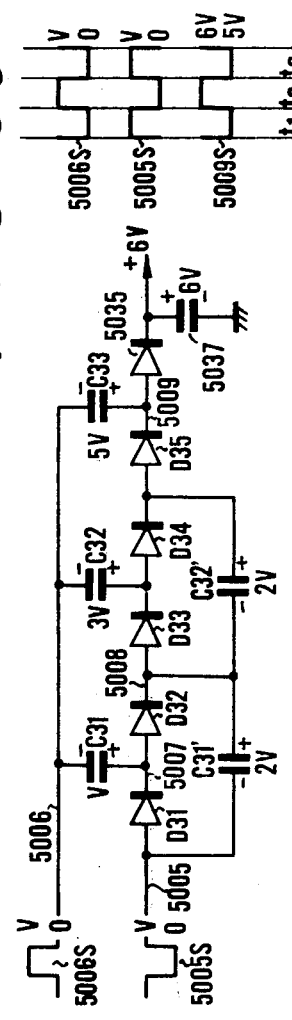
FIG. 30
FIG. 31A
FIG. 31B

BOOSTER CIRCUITS

CROSS-REFERENCE TO RELATED APPLICATION

This application is a continuation of our copending application Ser. No. 397,249 filed Sept. 14, 1973 and now abandoned.

FIELD OF THE INVENTION

Our present invention relates to a voltage-boosting circuit comprising a MOS field-effect transistor.

Background of the Invention

Conventional voltage-boosting circuits frequently make use of a coil and a bipolar transistor. These booster circuits themselves consume considerable power and hence are unsuitable for boosting a low voltage from a supply of limited power.

Thus, for example, a booster circuit of the well-known Cockcroft type comprises a number of stages each including one diode and one condenser, its boosting efficiency per stage being high. This conventional booster circuit, however, has the disadvantage that the use of a diode results in a forward voltage drop on the order of 0.5V which corresponds to a power loss of more than 30% when boosting a low voltage on the order of 1.5V, as in the case of an electronic clock circuit, requiring the use of numerous stages for attainment of a suitable voltage level whereby the consumed power is correspondingly increased. Such a circuit is therefore unsuitable as a booster for an electronic wristwatch which must operate with a minimum power loss.

Objects of the Invention

An object of our present invention is to provide a booster circuit of simple construction and low loss per stage.

Another object of the invention is to provide an improved ancillary booster circuit for raising a low voltage to a higher level in the input of a conventional Cockcroft circuit, serving to increase the voltage step-up per stage at a reduced rate of overall power loss.

Summary of the Invention

A voltage-boosting circuit according to our invention comprises at least one field-effect transistor whose semiconductive substrate is connected directly to a source electrode and coupled to a drain electrode through a P/N junction having a predetermined threshold voltage, the two drain and source electrodes being located at opposite ends of a channel region of the substrate whose conductivity is controlled by a gate as is well known per se. The source electrode is connected to a point of fixed reference potential, either directly or by way of a condenser inserted in its lead. The gate and drain leads extend to a supply of a voltage wave alternating between a first and a second level, i.e. a train of rectangular pulses, this wave being delivered to the gate and the drain in relatively inverted relationship and with interposition of a series capacitor between the supply and the gate. The reversal of the relative polarity of the drain and gate potentials during successive alternations of the applied voltage wave cuts off the transistor during every other alternation and renders it conductive in the intervening alternations with resulting equalization of the voltages of the drain and source electrodes, this equalization eliminating the residual potential difference existing in conventional circuitry of this character on account of the forward threshold of a diode.

According to another aspect of our invention, a semiconductive circuit of the aforedescribed type is used for supplying two mutually dephased square waves to the inputs of an otherwise conventional voltage-boosting circuit, of the above-mentioned Cockcroft type, wherein a first circuit branch comprises a series of capacitive networks connected between one input and odd-numbered junctions of a chain of serially interconnected diodes while a second circuit branch comprises another series of capacitive networks connected between the other input and even-numbered junctions of these diodes.

BRIEF DESCRIPTION OF THE DRAWING

The above and other features of our invention will now be described in detail with reference to the accompanying drawing in which:

FIGS. 1A and 1B are diagrammatic views showing prior-art field-effect transistors of the MOSFET type and illustrating the control circuits associated therewith;

FIGS. 2A and 2B are diagrammatic views showing MOS field-effect transistors according to our invention with their associated control circuits;

FIG. 2C is a diagrammatic representation of an equivalent circuit for the MOSFETs of FIGS. 2A and 2B;

FIGS. 3A, 6A, 9A and 13A are diagrammatic views of prior-art clamping circuits and FIGS. 3B, 6B, 9B and 13B show respective voltage waves;

FIGS. 4A, 5A, 7A, 8A, 10A, 11A, 12A, 14A, 15A and 16A are diagrammatic views of booster circuits comprising MOS field-effect transistors according to our invention and FIGS. 4B, 5B, 7B, 8B, 10B, 11B, 12B, 14B, 15B and 16B show respective voltage waves;

FIG. 17A is a diagram of a booster circuit according to the invention, with an output pulse of three times the input-pulse amplitude, and FIG. 17B shows the corresponding voltage waves;

FIGS. 18A and 19A are diagrams of booster circuits according to the invention adapted to deliver a direct-current output whose amplitude is twice as high as that of its input voltage and FIGS. 18B and 19B shows respective voltage waves;

FIG. 20A is a diagram of another booster circuit according to the invention with a direct-current output whose amplitude is twice as high as that of its input and FIG. 20B shows its voltage waves;

FIG. 26 is a diagram of a booster circuit according to the invention comprising MOS field-effect transistors with mutually different threshold voltages;

FIG. 27 is a diagram of a basically conventional Cockcroft-type booster circuit;

FIG. 28 is a diagram of a booster circuit according to the invention comprising two sections each including a prior-art Cockcroft circuit of the type shown in FIG. 27;

FIG. 29 is a diagram of a booster circuit according to the invention, adapted to deliver an output pulse with an amplitude equaling three times the input-pulse amplitude, combined with a prior-art Cockcroft circuit of the type shown in FIG. 27;

FIG. 30 is a diagram of a booster circuit according to the invention comprising two MOS field-effect transducer stages and one stage of a Cockcroft-type circuit;

FIG. 31A is a diagram of an improved Cockcroft-type booster circuit according to our invention and FIG. 31B shows its waveforms;

SPECIFIC DESCRIPTION

Figure 21:
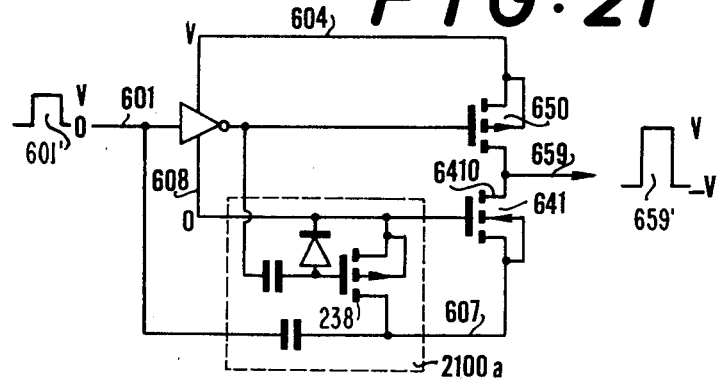
FIG. 21 is a diagram of a further booster circuit according to the invention delivering a direct-current pulse of twice the amplitude of the input pulse.

As is known in the art, a MOS field-effect transistor or MOSFET (where the letters "MOS" stand for metal-oxide-semiconductor) is essentially a voltage-controlled resistor or "channel region" linking two electrically separated, highly conductive electrodes (source and drain) of one conductivity type diffused into an opposite-conductivity-type substrate of semiconductive material.

In a prior-art MOSFET of P-channel type, in which a substrate is connected to one electrode 11 of two separated electrodes linked by a channel region as shown in FIG. 1A, a diode 15 shown in dotted lines is formed between the substrate and the other electrode 12 insulated from the substrate. This diode 15 has its cathode or N side at the electrode 11 (source) and its anode or P side at the electrode 12 (drain). It therefore is necessary with this P-channel MOSFET to hold the electrode 11 at a more positive potential than the electrode 12. Thus, the diode 15 is reverse-biased and a current I flows only in a channel region determined by the applied gate voltage as shown in FIG. 1A. In FIG. 1B there is shown an N-channel-type MOSFET in which a diode 16 indicated in dotted lines is formed between an electrode 13 (source) connected to the substrate and constituting the P side and an electrode 14 (drain) disconnected from the substrate and constituting the N side.

In this N-channel MOSFET the electrode 13 is held at a more negative potential than the electrode 14. Thus, the diode 16 is reverse-biased and a current I flows only in a channel region determined by the gate voltage as shown in FIG. 1B.

In the above-described conventional MOSFET used as a diode, the direction of the current I is opposite to the forward direction of the diode 15 or 16 formed across the source and drain electrodes 11, 12 or 13, 14 at opposite ends of the channel region. As a result, the MOSFET can be used as a diode in its forward direction, but could not be used as a diode in its reverse direction even if the gate potential is modified.

In accordance with our present invention, use is made of a P-channel MOSFET in such a manner that a source electrode 21 connected to the substrate 25 constitutes the N side of a diode 27 shown in dotted lines and that a drain electrode 22 insulated from the substrate 25 constitutes the P side of the diode 27 as shown in FIG. 2A. Similarly, an N-channel MOSFET is used in such a manner that an electrode 23 coupled to the substrate 26 constitutes the P side of a diode 28 shown in dotted lines and that an electrode 24 insulated from the substrate 26 constitutes the N side of the diode 28 as shown in FIG. 2B and schematically represented in FIG. 2C.

If the electrode 24 constituting the N side of the diode 28 is at a more positive potential than the electrode 23 constituting the P side, it is possible to control the gate potential so as to cut off the MOSFET. In this case, a reverse voltage is applied across the diode 28 formed between the source and drain electrodes 23, 24 at opposite ends of the channel region, and no current traverses the MOSFET as in a conventional diode.

If the potential at the electrode 23 constituting the P side of the diode 28 is more positive than that of the electrode 24 constituting the N side, it is possible to control the gate potential so as to make the MOSFET conductive. In this case, a forward voltage is applied across the diode 28 formed between the electrodes 23, 24 and, as a result, a current flows through the MOSFET in the same manner as in the conventional diode illustrated in FIG. 2C. In addition, the current I also traverses the channel region as shown in FIG. 2B. With a small potential difference across the electrodes 23, 24 the drain current $I_D$ flowing through the channel region is given by $$I_D = -\beta[(V_G-V_{th})V_D - \tfrac{1}{2}V_D^2]$$

where $\beta$ = constant inherent in circuit elements
$V_G$ = voltage difference between the source and the gate
$V_{th}$ = threshold voltage
$V_D$ = potential difference across the channel region (voltage drop between the source and the drain).

Hence, if $V_G$ is so chosen that the condition $$V_G > V_{th} + \tfrac{1}{2}V_D$$

is satisfied, even a minute voltage drop $V_D$ across the channel region causes a current $I_D$ to flow through the channel.

In this case, a forward voltage drop is absent contrary to the situation in a conventional diode; this provides an ideal forward diode characteristic.

Thus, the operation of the MOSFET according to the invention has the following characteristics:

1. The MOSFET is used without a biasing potential between the source and drain electrodes lying at opposite ends of the channel region.
2. A current flows through a P/N junction formed between these channel electrodes and through the substrate.
3. The relative polarity of the channel electrodes in the conductive state of the MOSFET is the reverse of that of the prior art.

FIG. 3A shows a prior-art clamping circuit comprising a diode 37 and a condenser 36. FIG. 4A shows a booster circuit according to our invention comprising an N-channel depletion-type MOSFET replacing the diode shown in FIG. 3A. FIG. 5A shows a booster circuit according to the invention comprising an N-channel enhancement-type MOSFET instead of the diode shown in FIG. 3A.

In the prior-art clamping circuit shown in FIG. 3A, if a signal 31' varying between 0 and V at instants $t_2, t_2, t_3$, as shown in FIG. 3B, is supplied to a line 31 and a biasing voltage V is applied via a line 33 to the anode of diode 37, condensor 36 is charged with a voltage obtained by subtracting a forward voltage drop $V_{Di}$ from biasing voltage V, i.e. with a voltage $V-V_{Di}$ of the polarity indicated in FIG. 3A, and, as a result, a line 32 tied to the cathode of diode 37 carries a signal 32' varying between $2V-V_{Di}$ and $V-V_{Di}$ as shown in FIG. 3B.

In the booster circuit shown in FIG. 4A, a voltage 44' varying between 0 and V, as shown in FIG. 4B, is applied to a line 44 with the aid of an inverter 41.

An N-channel depletion-type MOSFET 42 becomes nonconductive when the gate thereof, tied to the lead 44, has a more negative potential than its drain, i,e, the electrode at one end of the channel region which is lower in potential than the other electrode or source by the threshold voltage $V_{th}$ as discussed above. In FIG. 4A the source is shown biased with a voltage V by a lead 43. At times $t_1$ and $t_3$ shown in FIG. 4B, when an input lead 46 is at potential 0 as indicated in graph 46', the gate potential 44' on lead 44 is V so that the MOSFET 42 conducts. Thus, a condenser 47 is charged with a voltage V of the polarity indicated in FIG. 4A, owing to the absence of a forward voltage drop across the diode contrary to the prior-art clamping circuit shown in FIG. 3A. During these periods, therefore, a drain lead 45 connected to the condenser 47 carries the same voltage V as shown by graph 45'.

As further shown in FIG. 4B, at time $t_2$ the input lead 46 has its potential 46' raised to the level V while the gate potential 44' on lead 44 drops to 0 so that, if V exceeds the threshold voltage $V_{th}$, the MOSFET 42 is cut off. Thus, the potential on the line 45 becomes 2V which is the sum of the potential on the line 46 and the voltage V stored in the condenser 47. Now, the diode formed between the channel electrodes is reverse-biased so that a discharge path for the electric charge accumulated in the condenser 47 is blocked. As a result, the voltage 45' on line 45 alternates between levels V and 2V, as shown in FIG. 4B, without any power loss.

In the circuit of FIG. 5A comprising an N-channel enhancement-type MOSFET 52, a diode 50 and a condenser 51 in the output of an inverter 54 constitute a clamping circuit which can generate a signal for switching the MOSFET 52. If the biasing potential of a source lead 53 is again V and a signal 58' as shown in FIG. 5B is supplied to an input line 58, the condenser 51 is charged with a voltage $V-V_{Di}$ of the polarity shown in FIG. 5A and a signal 57' as shown in FIG. 5B is supplied to a gate lead 57, this signal alternating between levels $V-V_{Di}$ and $2V-V_{Di}$ as described with reference to FIGS. 3A and 3B. The MOSFET 53 conducts when its gate potential exceeds its source potential by at least $V_{th}$ and is cut off in all other instances. Thus, if V is so chosen that the condition $V-V_{Di} > V_{th}$ is satisfied (this being the case in all embodiments to be described later), the MOSFET 52 conducts at times $t_1$ and $t_3$ and becomes nonconductive at time $t_2$ shown in FIG. 5B. Then, in the same manner as in the circuit of FIG. 4A, a signal 55' alternating between levels V and 2V as shown in FIG. 4B appears on a drain lead 55. The line 57 is connected only to the gate of the MOSFET 52 and is not under load so that a power loss due to the diode 50 can be disregarded. Graph 54' of FIG. 5B shows the voltage swing on an output lead 54 of inverter 59.

In each embodiment of our invention described hereinafter, the power loss of a clamping circuit consisting of a diode and a condenser, serving to switch an associated MOSFET, can also be disregarded.

If it is possible to establish suitable threshold values for the MOSFET with the aid of ion implantation, for example, the clamping circuit for controlling these threshold values can be replaced by a simple condenser for accumulating a boosting charge. In this case, the threshold values of any MOSFET in the same integrated circuit may be individually defined without adding any circuit elements, with significantly improved integratability of the circuit.

FIG. 6A shows another prior-art clamping circuit comprising a diode 68 and a condenser 67 operating with reversed polarity compared to the circuit shown in FIG. 3A.

FIG. 7A shows a booster circuit according to the invention comprising a P-channel depletion-type MOSFET 70 instead of the diode 68 shown in FIG. 6A. FIG. 8A shows a booster circuit according to the invention comprising a P-channel enhancement-type MOSFET 82 instead of the diode 68 shown in FIG. 6A.

In the prior-art clamping circuit shown in FIG. 6A, if a signal 65' shown in FIG. 6B is supplied to a line 65 and a line 69 carries zero bias, a condenser 67 is charged with a voltage $V-V_{Di}$ of the polarity indicated in FIG. 6A and, as a result, a line 64 carries a signal 64' shown in FIG. 6B.

The P-channel depletion-type MOSFET shown in FIG. 7A conducts unless its gate potential exceeds that of the more positively biased channel electrode (i.e. its source) by at least the threshold voltage $V_{th}$. Thus, the MOSFET 70 is cut off at time $t_1$ and $t_3$ and is turned on at time $t_2$ as shown in FIG. 7B. At time $t_2$, the potential 71' on input line 71 is V and, as the potential on source lead 79 is 0, the condenser 72 is charged with voltage V of the polarity indicated in FIG. 7A. At times $t_1$ and $t_3$, the MOSFET 70 is nonconductive and, as a result, the potential 73' of an output lead 73 is obtained by subtracting the voltage V stored on condenser 72 from the zero potential 71' of line 71, this output voltage being thus equal to V. Graph 77' represents the gate voltage in the output of an inverter 75.

In this case, a reverse voltage is applied across the diode shunting the channel region so that the discharge path for the condenser 72 is blocked. As a result, a loss-free signal 73' as shown in FIG. 7B appears on the line 73.

In the booster circuit according to the invention shown in FIG. 8A, a condenser 80 and a shunt diode 81 constitute a clamping circuit or ancillary booster stage which can generate a signal for switching a P-channel enhancement-type MOSFET 82. Diode 81 is inserted between the gate and source leads of this MOSFET in series-opposed relationship with the virtual diode or P/N junction 27. The potential of a source lead 89 is again zero and a line 84 in the output of inverter 75, to which an input voltage 83' is fed via a lead 83, carries a signal 84' shown in FIG. 8B so that the condenser 80 is charged with a voltage $V-V_{Di}$ of the polarity indicated in FIG. 8A and, as a result, a signal 85' shown in FIG. 8B is supplied to a gate lead 85. The MOSFET 82 conducts when the gate potential is lower than the source potential (0), i.e. goes negative, by at least $V_{th}$ so that MOSFET 82 is turned on at time $t_2$ and cut off at times $t_1$ and $t_3$ as shown in FIG. 8B. Then, in the same manner as in FIG. 7A, an output signal 86' shown in FIG. 8B appears on a line 86.

FIG. 9A shows a prior-art rectifying and clamping circuit comprising a diode 90 and a condenser 91 supplementing the elements 36, 37 of FIG. 3A. FIG. 10A shows a booster circuit according to our invention which can operate as a rectifying and clamping circuit and in which a P-channel enhancement-type MOSFET 100 replaces the diode 90 shown in FIG. 9A. FIG. 11A shows a booster circuit according to the invention which can operate also as a rectifying and clamping circuit and in which an N-channel depletion-type MOSFET 111 is used instead of a shunt diode 101 shown in FIG. 10A.

In the conventional clamping circuit of FIG. 9A, the application of an input voltage 31' to a line 31 as in FIG. 3A generates a signal 92', shown in FIG. 9B, on a line 92 in the output of capacitor 36, this signal 92' being rectified by the diode 90 to charge the condenser 91 with a voltage $V-2V_{Di}$ obtained by substracting from its peak value $2V-V_{Di}$ the forward voltage drop of the diode 90 with the polarity shown in FIG. 9A; as a result, an output lead 93 carries a d-c voltage $2V-2V_{Di}$. The junction of diode 37 with condenser 91 may be energized with any constant potential, yet it is preferable to make the magnitude small, taking the breakdown voltage, leakage etc. of the rectifying condenser 91 into consideration.

In the circuit shown in FIG. 10A, if the P-channel enhancement-type MOSFET 100 is always cut off, the virtual diode formed between its channel electrodes causes that circuit to operate in the same manner as the circuit of FIG. 9A. With electrode potentials as shown in FIG. 10B, the MOSFET 100 becomes nonconductive at times $t_1$ and $t_3$. Thus, the potential 107' of a drain lead 107 separated by capacitor 47 from an input lead 106 is $2V-V_{Di}$; a line 103 connecting a condenser 104 to the anodes of diodes 50 and 101 has a potential V so that the condenser 104 is charged with a voltage $V-V_{Di}$ of the polarity indicated in FIG. 10A without being subjected to the forward voltage drop of the rectifying diode 90 shown in FIG. 9A. As a result, an output lead 105 is energized with a d-c voltage $2V-V_{Di}$. At times $t_1$ and $t_3$, the drain voltage 107' is $V-V_{Di}$ and the source voltage on line 105 is still $2-V-V_{Di}$ so that the virtual diode formed between the channel electrodes of the MOSFET 100 is back-biased. Thus, the discharge path for the condenser 104 is blocked, thereby maintaining the potential on the line 105 at $2V-V_{Di}$. Lead 106 receives an input signal 106' giving rise to a signal 108' on a line 108 in the output of inverter 41 and to a signal 109' on a line 109 separated from line 108 by capacitor 51.

Clamping-circuit elements 41, 47, 50, 51 and 52 shown in FIG. 11A correspond to those shown in FIG. 5A so that a line 115 separated by capacitor 47 from input lead 46 carries a signal 115' shown in FIG. 11B. As a result, a condenser 114 is charged with a voltage V of a polarity as shown in FIG. 11A without the voltage loss caused by the diode 90 of FIG. 9B and an output lead 116 is energized with a d-c voltage 2V. FIG. 10B also shows voltages 111' and 119' of gate leads 111 and 119 of MOSFETs 52 and 110.

The same clamping-circuit elements are also shown in FIG. 12A where a line 125 is energized with a d-c output voltage 2V. To a line 122 is supplied an input signal 122' translated by inverter 41 into a signal 123' on a lead 123; through capacitor 51, a line 124 receives a signal 124' fed to the gate of MOSFET 52 whose drain lead 126, also tied to the drain of a MOSFET 120, carries a signal 126'.

FIG. 13A shows a prior-art rectifying and clamping circuit which is opposite in polarity to the circuit shown in FIG. 9A. FIG. 14A shows a rectifying and clamping circuit according to the invention in which an N-channel enhancement-type MOSFET 140 replaces a rectifying diode 133 shown in FIG. 13A. FIG. 15A shows another rectifying and clamping circuit according to the invention in which a P-channel depletion-type MOSFET 153 is used instead of a clamping diode 141 shown in FIG. 14A. FIG. 16A shows a further rectifying and clamping circuit according to the invention in which a P-channel enhancement-type MOSFET 161 is used instead of the clamping diode 141 shown in FIG. 14A.

The prior-art clamping circuit shown in FIG. 13A comprises a condenser 134 and a diode 148, corresponding to elements 67 and 68 of FIG. 6A, combined with the rectifying diode 133 and a condenser 131. A signal 135' shown in FIG. 13B, derived from an input voltage 147' on a lead 147 via capacitor 134, appears on a line 135 and is rectified by the diode 133 to charge the condenser 131 with a voltage $V-2V_{Di}$ obtained by substracting the forward voltage drop of diode 133 from the signal 135' with the polarity shown in FIG. 13A; as a result, a line 132 receives a d-c output voltage $-(V-2V_{Di})$.

In FIG. 14A, if the N-channel enhancement-type MOSFET 140 is always cut off, the diode formed between the channel electrodes of that MOSFET causes this circuit to operate in the same manner as the one shown in FIG. 13A. At potentials as shown in FIG. 14B, a drain lead 146 of MOSFET 141 carries a signal 146' while an output lead 148 of inverter 75 carries a signal 148' and, via capacitor 80, energizes a gate lead 149 of the MOSFET with a signal 149'. Thus, the MOSFET 140 becomes conductive at times $t_1$ and $t_3$ and is cut off at time $t_2$. At times $t_1$ and $t_3$, the potential 146' of line 146 is $-(V-V_{Di})$; a line 142 forming a junction between a condenser 145 and the cathodes of diodes 81 and 141 is at zero potential so that condenser 145 is charged with a voltage $V-V_{Di}$ (without the forward voltage drop of the rectifying diode 133 shown in FIG. 13A) with the polarity indicated in FIG. 14A. As a result, a line 143 is energized with a d-c output voltage $-(V-V_{Di})$. At time $t_2$ shown in FIG. 14B, the potential 146' on the line 146 is $V_{Di}$ and the potential on the line 143 is still $-(V-V_{Di})$ so that a virtual diode 140a formed between the channel electrodes of the MOSFET 140 is back-baised. Thus, a discharge path for the condenser 145 is blocked, thereby maintaining the potential of line 143 at its value of $-(V-V_{Di})$.

The clamping-circuit elements 72, 75, 80 and 81 shown in FIG. 15A correspond to those shown in FIG. 7A so that a line 151 separated by capacitor 72 from a lead 162 carrying an input signal 162' receives a signal 151' shown in FIG. 15B. As a result, a condenser 152 is charged with a voltage V (without the voltage loss caused by a virtual diode 150a of a MOSFET 150) with the polarity shown in FIG. 15A, thereby supplying a d-c output voltage $-V$ to a line 158. An output lead 154 of inverter 75 receives a signal 154' whereas a gate lead 155 of MOSFET 150 receives a signal 155'.

The clamping-circuit elements 72, 75, 80 and 81 are also included in the circuit of FIG. 16A wherein, as in the circuit shown in FIG. 15A, a line 168 is energized with a d-c output voltage $-V$.

Input lead 162 again receives a signal 162', shown in FIG. 16B; a line 163 in the output of inverter 75 carries a signal 163', a line 164 coupled to line 154 by capacitor 80 is supplied a signal 164', and a common drain lead 165 for MOSFETs 169 and 161 is pulsed with a voltage 165'.

In the above embodiments, if the MOSFET is designed as an individual body, the use of a depletion-type field-effect transistor enables the circuit to be simplified, yet is the MOSFET is incorporated into an integrated circuit, it is preferably of the enhancement type.

FIG. 17A shows a booster circuit according to the invention with two branches each including a MOSFET used as a diode. Reference numeral 201 designates a power-supply line carrying both direct-current and alternating-current components. The supply line 201 is connected through a condenser 235 and a clamping MOSFET 234 to a d-c bus bar 204. One of the channel electrodes (source and drain) of the MOSFET 234, specifically the source is connected to the bus bar 204 carrying a voltage V. To the gate 234G of the MOSFET 234 is supplied, on a lead 203, a signal 203' (FIG. 17B) which is opposite in phase to the input signal 201' and issues from an inverter 231 having an output lead 202, signal 203' being clamped by means of a diode 233 and a condenser 232 to the level V of bus bar 204 establishing its minimum value at $V-V_{Di}$. The clamping circuit of this branch, including the MOSFET 234, has been shown as a dotted-line block 2100. To a junction 205 between the other channel electrode (drain) of the clamping MOSFET 234 and the condenser 235 is connected one of the channel electrodes (source) 240S of a switching MOSFET 240 whose gate 240G is connected to the bus bar 204. The other channel electrode (drain) 240D of the switching MOSFET 240 is connected to an output lead 209. The second branch of the booster circuit shown in FIG. 17A comprises a clamping circuit shown as a dotted-line block 2100a which includes a condenser 236 and a diode 237, the latter being connected to a bus bar 208 of zero potential establishing an upper limit $+V_{Di}$ for the voltage 206' of a lead 206 tied to the gate 238G of a MOSFET 238. Bus bar 208 extends to the gate 241G of a switching MOSFET 241 to whose channel electrode 241D (drain) is connected the output lead 240D of MOSFET 240. Block 2100a further includes a capacitor 239 coupling the input lead 201 to a lead 207 connected to the drain of MOSFET 238 and to the source 241S of MOSFET 241.

The operation of the circuit shown in FIG. 17A is as follows:

If a signal 201' is applied to the line 201, a signal 202' shown in FIG. 17B appears on the output lead 202 of inverter 231. Then, at time $t_2$, the diode 233 connected to the positive voltage V on bus bar 204 causes the condenser 232 to be charged with a voltage $V-V_{Di}$ obtained by subtracting $V_{Di}$, which is the forward voltage drop of this diode, from V with the polarity indicated in FIG. 17A. At times $t_1$ and $t_3$, the discharge path for the condenser 232 is blocked and, as a result, a potential difference of $V-V_{Di}$ is always maintained between the line 203 and the line 202 wherefore the line 203 carries a signal 203' shown in FIG. 17B. Thus, the N-channel enhancement-type MOSFET 234 conducts only when its gate 234G is at a more positive potential than its source electrode by at least the threshold voltage $V_{th}$. Moreover, a P/N junction is present between the substrate and the channel electrode (source) 240S connected to the line 205, the substrate being the P side and the electrode 240S being the N side of the P/N junction. Thus, the MOSFET 234 operates in the same manner as a diode connected between the lines 204 and 205 with its anode tied to the bus bar 204. The potential of line 205 does not fall by at least $V_{Di}$ below the bus-bar potential V so that, if the signal 203' shown in FIG. 17B is applied to the gate 234G of the MOSFET 234 and the condition $(V-V_{Di}) > V_{th} > V_{Di}$ is satisfied, the MOSFET 234 conducts at times $t_1$ and $t_3$ and is cut off at time $t_2$ (the above condition is also considered satisfied by the MOSFETs shown in the embodiments described below). At time $t_2$, the discharge path for the condenser 235 is blocked so that a potential difference V is always maintained between the lines 205 and 201. As a result, the line 205 carries a signal 205' shown in FIG. 17B. At this time, the P/N junction between the bus bar 204 and the line 205 is subjected to a reverse voltage so that the bus-bar potential does not affect the potential of the line 205.

At times $t_1$ and $t_3$, condenser 236 is charged with a voltage $V-V_{Di}$ obtained by subtracting the forward voltage drop $V_{Di}$ of diode 237 from V with the polarity shown in FIG. 17A. At time $t_2$, a discharge path for the condenser 236 is blocked so that a potential difference of $V-V_{Di}$ is maintained between lines 206 and 202. As a result, the line 206 receives a signal 206' shown in FIG. 17B. The P-channel enhancement-type MOSFET 238 conducts only when its gate 238G is of more positive potential than its source electrode by at least $V_{th}$. Between the substrate of the MOSFET 238 and its channel electrode (drain) connected to the line 207 a P/N junction exists whose N side is connected to the substrate and whose P side is connected to the line 207 whereby the potential of line 207 does not rise by at least $V_{Di}$ above the potential of line 208. If the signal 206' shown in FIG. 17B is applied to the gate 238G of the MOSFET 238, this MOSFET conducts at time $t_2$ and is cut off at times $t_1$ and $t_3$. At time $t_2$, the input voltage in line 201 is V and, with bus bar 208 at 0, the MOSFET 238 is conductive so that condenser 239 is charged with a voltage V of the polarity indicated in FIG. 17A. At times $t_1$ and $t_3$, the discharge path for the condenser 239 is blocked so that a potential difference of V is always maintained between the lines 207 and 201. As a result, the line 207 carries a signal 207' shown in FIG. 17B. At this time, the P/N junction formed between the line 207 and the bus bar 208 is subjected to a reverse voltage so that the bus-bar potential does not affect the potential of line 207. The P-channel enhancement-type MOSFET 240 has its gate potential fixed at V. Thus, if the signal 205' shown in FIG. 17B is applied to the source 240S, the MOSFET 240 conducts at time $t_2$ and cuts off at times $t_1$ and $t_3$ whereby, at time $t_2$, the potential 209' on line 209 becomes 2V. The N-channel enhancement-type MOSFET 241 has its gate potential fixed at 0. Thus, if the signal 207' shown in FIG. 17B is applied to its source 241S, the MOSFET 241 conducts at times $t_1$ and $t_3$ and cuts off at time $t_2$ whereby at times $t_1$ and $t_3$ the potential of line 209 becomes —V. Thus, the output signal 209' on line 209 has an amplitude three times as high as the amplitude of the input signal 201'.

In FIG. 18A we have shown a direct-current booster circuit according to the invention comprising a first clamping stage 2100 of the type shown in FIG. 17A, with a P-channel enhancement-type rectifying MOSFET 320 connected thereto, and a second clamping stage 2100b whose input signal is supplied through an inverter 331 so as to vary in phase opposition to that of the clamping stage 2100, with a P-channel enhancement-type rectifying MOSFET 320b connected thereto, an output terminal 320' of the first clamping stage 2100 being connected to an output terminal 320b' of the second clamping stage 2100b.

A signal 301' shown in FIG. 18B is applied to an input lead 301 from which a line 305 receives a signal 305', shown in FIG. 18B, by way of capacitor 235. A lead 323 extending to the gate of the rectifying MOSFET 320 carries a signal 323' shown in FIG. 18B whereas a line 305b carries a signal 305b' shown in FIG. 18B and the gate of the rectifying MOSFET 320b is energized by the signal 305' in parallel with the drain of MOSFET 320.

At time $t_2$, the potential 305' on line 305 is 2V and the gate potential 323' of the rectifying MOSFET 320 is V—$V_{Di}$ so that the rectifying MOSFET 320 becomes conductive to make the potential of the output line 319 equal to 2V. At this time, the potential 305b' of line 305b is V and the gate potential 305' of the rectifying MOSFET 320b is 2V. The gate potential 305' of the rectifying MOSFET 320b is the same as that of its more positive channel electrode (drain) so that the rectifying MOSFET 320b becomes nonconductive.

At this time, a P/N junction formed between the MOSFET 320b and the line 305b is subjected to a reverse voltage so that the voltage 305b' exerts no influence upon the output potential on line 319. Similarly, at times $t_1$ and $t_3$, the MOSFET 320b becomes conductive and the MOSFET 320 becomes nonconductive so that the output line 319 carries a voltage 2V in the same manner as at time $t_2$. Between a d-c supply bus bar 308, held at zero potential, and the output line 319 there exists, accordingly, a potential difference 2V which is twice the d-c supply voltage V on a bus bar 304.

In FIG. 19 we have shown an analogous direct-current booster circuit which comprises a first clamping stage 2100a of the type shown in FIG. 17A, with an N-channel enhancement-type rectifying MOSFET 430 connected thereto, and a second clamping stage 2100c whose input signal is applied through an inverter 431 so as to vary in phase opposition to that of the clamping stage 2100a, with an N-channel enhancement-type rectifying MOSFET 430b connected thereto. An output terminal 430' of the first clamping stage 2100a is connected to an output terminal 430b' of the second clamping stage 2100c. Two bus bars 404 and 408 carry voltages V and 0, respectively.

In this case, if the potential of a line 407 goes to —V during pulsing of an input lead 401 with a signal 401', the MOSFET 430 becomes conductive, and if the potential of a line 407c is —V, the MOSFET 430b becomes conductive, whereby a direct-current output voltage —V is obtained. Thus, between a d-c supply bus bar 404, of potential V, and an output line 419' there exists a potential difference 2V which is twice the d-c supply voltage.

In FIG. 20A we show a pulse-booster circuit according to the invention comprising a block 2100 as shown in FIG. 17A connected to a switching MOSFET 540 and an N-channel enhancement-type grounding MOSFET 542 connected between an output terminal 540D of the block 2100 and a d-c supply bus bar 508 of zero potential.

A signal 501' also shown in FIG. 20B is applied to an input lead 501, a line 505 is supplied a signal 505' shown in FIG. 20B and the gate of the grounding MOSFET 542 is energized via an inverter 531 and a lead 502 with a signal 502' shown in FIG. 20B.

The gate potential of the MOSFET 540, supplied by a bus bar 504, is fixed at V while the source of the MOSFET 542 is grounded at bus bar 508. As a result, at times $t_1$ and $t_3$ the MOSFET 540 becomes nonconductive and the MOSFET 542 becomes conductive whereby the potential 549' of an output line 549 becomes 0 whereas at time $t_2$ the MOSFET 540 becomes conductive and the MOSFET 542 becomes nonconductive and hence the output potential 549' becomes 2V. Thus, the output signal 529' has twice the amplitude of the input signal 501'.

In FIG. 21 we show a booster circuit according to the invention comprising a block 2100a as shown in FIG. 17A and a switching MOSFET 641, a P-channel enhancement-type grounding MOSFET 650 being connected between the output electrode (drain) 641D of the MOSFET 238 in block 2100a and a d-c supply bus bar 604 of voltage V.

In the present embodiment, if the potential of a line 607 is —V, the switching MOSFET 641 becomes conductive and the grounding MOSFET 650 becomes nonconductive and hence the potential 659' of an output line 659 becomes —V. If the potential of line 607 is 0, the switching MOSFET 641 becomes nonconductive and the grounding MOSFET 650 becomes conductive and hence the output voltage 659' becomes V. As a result, signal 659' has twice the amplitude of the input signal 601' on a line 601.

Figure 22:
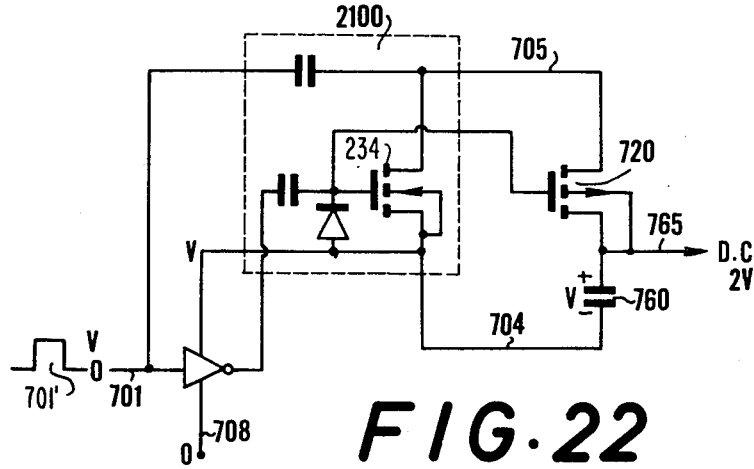
FIGS. 22 and 23 are diagrams of booster circuits according to the invention each adapted to deliver a direct-current voltage which is two times the input voltages.

FIG. 22 shows a direct-current booster circuit according to the invention comprising a block 2100 as shown in FIG. 17A; a P-channel enhancement-type MOSFET 720 and a rectifying condenser 760 lie between a d-c supply bus bar 704 of voltage V and a drain lead 705 of the MOSFET 234 in block 2100.

Upon the application of pulses 701' of amplitude V to an input lead 701, the rectifying MOSFET 720 becomes conductive only when the potential on line 705 is 2V whereby the rectifying condenser 760 is charged with a voltage V of the polarity shown in FIG. 22.

Thus there exists, between an output line 765 and a grounded bus bar 708, a potential difference 2V which is twice the d-c supply voltage.

Figure 23:
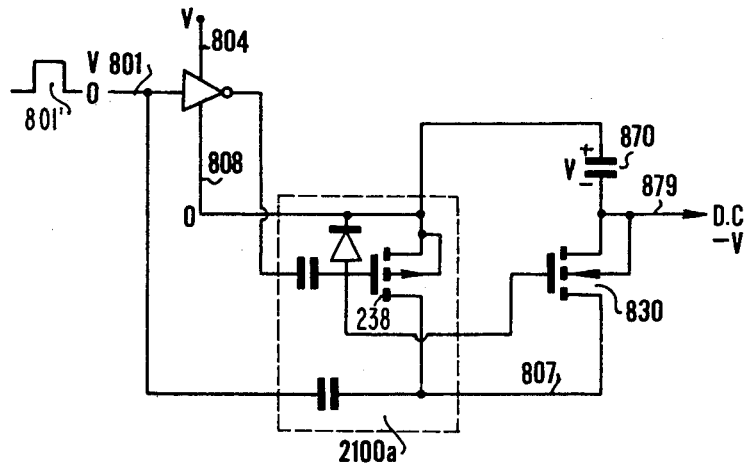

FIG. 23 shows a similar direct-current booster circuit according to the invention comprising a block 2100a as shown in FIG. 17A; an N-channel enhancement-type MOSFET 830 and a rectifying condenser 870 lie between a d-c supply bus bar 808 of voltage 0 (ground) and a drain lead 807 of the MOSFET 238 of block 2100a.

In the presence of pulses 801' of amplitude V on an input lead 801, the rectifying MOSFET 830 becomes conductive only when the potential on a line 807 is —V whereby the rectifying condenser 870 is charged with a voltage V of the polarity shown in FIG. 23. As a result, there exists between an output line 879 and a d-c supply bus bar 804 of voltage V a potential difference 2V which is twice the d-c supply voltage.

Figure 24:
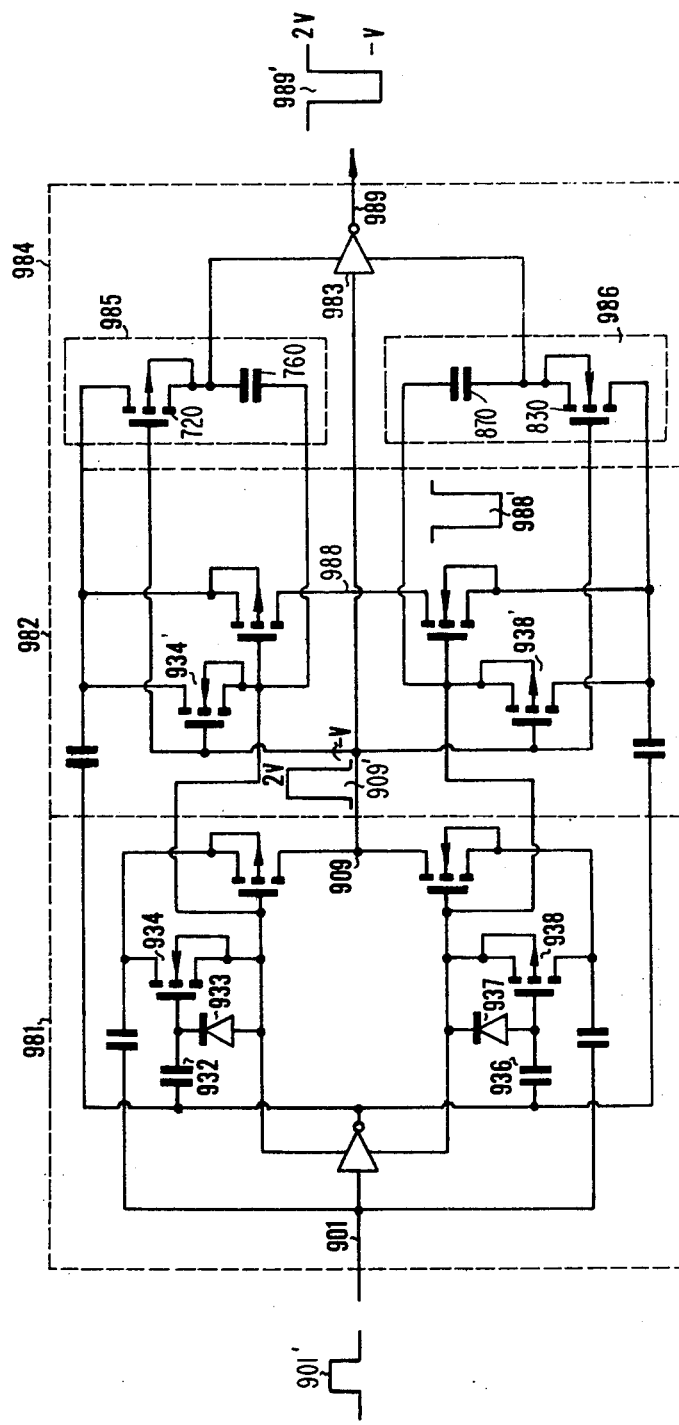
FIG. 24 is a diagram of a booster circuit according to the invention which delivers an inverted output pulse of an amplitude equaling three times that of the input pulse.

In FIG. 24 we show a pulse-booster circuit according to the invention comprising a block 981 which corresponds to the circuit shown in FIG. 17A, a block 982 which is identical with block 981 and connected thereto, and a block 984 connected to the block 982. The latter block consists of two rectifying networks 985 and 986 with MOSFETs 720, 830 and capacitors 760, 870, as shown in FIGS. 22 and 23, and an inverter 983.

In the presence of pulses 901' on an input lead 901, a pulsating signal 909' on an output lead 909 of block 981 energizes the block 982 and generates on an output line 988 of block 982 a signal 988' of relatively inverted phase. Rectifying networks 985 and 986 of block 984 are energized with a potential difference which has the same amplitude as the pulse signals 909' and 988' on lines 909 and 988, respectively. This potential diference is used as a d-c supply voltage for the inverter 983 which thereby delivers to an output line 989 a signal 989' of inverted phase with reference to the signal 909'. Thus, the embodiment of FIG. 24 acts as a signal inverter.

Clamping MOSFETs 934' and 938' in block 982 correspond to clamping MOSFETs 934 and 938 in block 981. The use of the output signal 909' from block 981 makes it possible to omit in block 982 the equivalent of clamping diodes 933 nd 937 and condensers 932 and 936 shown in block 981.

Figure 25:
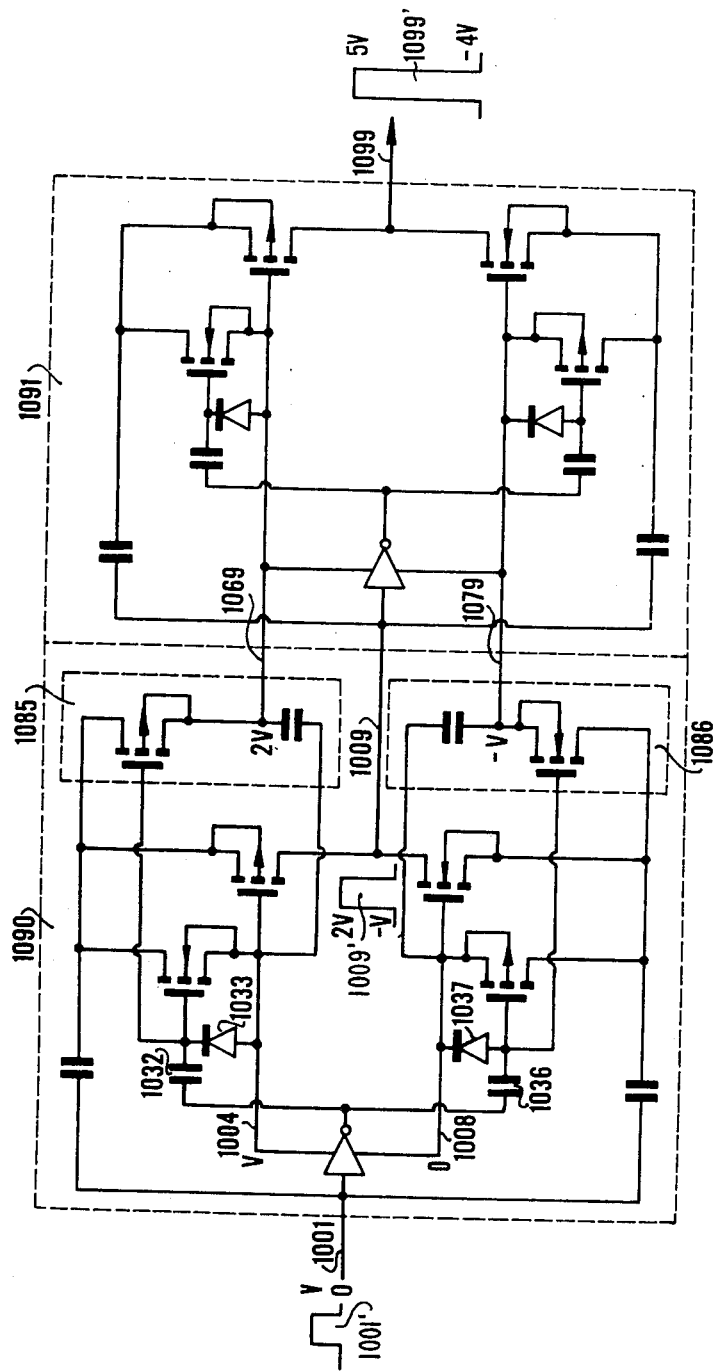
FIG. 25 is a diagram of a two-stage booster circuit according to the invention, each stage including the circuit arrangement shown in FIG. 17A delivering an output pulse of three times the input-pulse amplitude.

In FIG. 25 there is shown a similar booster circuit according to the invention comprising a block 1090 corresponding to the circuit shown in FIG. 17A, including capacitors 1032, 1036 and diodes 1033, 1037, with the addition of two rectifying networks 1085 and 1086, and a block 1091 which is identical with block 1090 except for the absence of these networks. D-c voltages 2V and —V appearing on output lines 1069 and 1079 of the block 1090 represent a potential difference 3V which is three times that of a d-c supply voltage present on a pair of bus bars 1004 and 1008 of potentials V and 0, respectively. A pulsed output 1009' produced on an output line 1009 has an amplitude which is three times that of an input signal 1001' on a line 1001 driving the block 1091.

Thus, the block 1091 is energized with three times the a-c and d-c voltages used with the circuit of FIG. 17A so that its output line 1099 carries a pulse signal 1099' whose amplitude is three times that of a signal 1009' produced on an output line 1009 of block 1090, thus nine times as high as that of the input signal 1001'. By the same token, a multistage connection is capable of delivering a still higher output voltage.

A combination of the embodiments shown in FIG. 17 to 23 yields various types of multistage connections.

In FIG. 26 we show a booster circuit according to the invention which can operate in the same manner as the block 1090 shown in FIG. 25 and in which use is made of depletion-type MOSFETs 1101 and 1102 switched by a controlled threshold voltage, thereby deviating obviating the need for the diodes 1033, 1037 and condensers 1032, 1036 shown in FIG. 25.

In this embodiment, the threshold voltage $V_{th}$ of the MOSFETs 1101 and 1102 is defined by $$0 < |V_{th}| < V.$$

In addition, MOSFETs 1103, 1104 of the enhancement type have a threshold $V_{th}$ also defined by $$0 < |V_{th}| < V.$$

Two further MOSFETs 1105, 1106, also of the enhancement type, have a threshold voltage $V_{th}$ defined by $$0 < |V_{th}| < 2V.$$

An input signal 1121' on a line 1121 results in the energizaton of an output lead 1109 connected to the drains of MOSFETs 1103 and 1104.

We shall now describe several embodiments of a highly efficient booster circuit according to out invention comprising a MOSFET, operating as a diode, combined with a Cockcroft-type booster circuit. The Cockcroft-type booster circuit makes use of a diode so that, if it is desired to boost from a low voltage on the order of 1.5V, the forward voltage drop of the diode on the order ot 0.5V corresponds to a voltage loss on the order of 30%. If the number of the circuit stages is increased for the purpose of boosting the low input voltage to any desired output voltage, the above-mentioned voltage loss is added to the power loss caused by the increase in the number of stages. In the embodiments to be described hereinafter, the booster circuit including a MOSFET is capable of initially raising the input voltage to an elevated level and this stepped-up voltage can be used as an input voltage for the Cockcroft-type booster circuit, thus affording an increased voltage step-up for a given number of stages and a decrease in the rate of forward voltage drop caused by the diodes thereof. This reduces the number of circuit elements necessary, thereby improving the operating efficiency.

FIG. 27 shows a basically conventional Cockcroft booster circuit with two inputs receiving relatively phase-inverted signals. FIGS. 28 to 30 show booster circuits according to the invention which can raise a low input voltage of 1.5 volts to an output voltage on the order of 25 volts.

The Cockcroft booster circuit shown in FIG. 27 must have a large number of circuit elements in order to produce a desired output voltage. In addition, each diode causes a forward voltage drop on the order of 0.5 volt so that one diode can boost by 1V only, wherefore 25 diodes D1 – D25 are required in order to stepup an input voltage V' ° 1 volt to an output voltage of 25 volts.

The booster circuit shown in FIG. 28 makes use of two Cockcroft-type booster circuits. In the present embodiment, a block 2001 constitutes a first booster circuit which can step up a supply voltage of 1.5 volts to a direct-current output of about 5 volts. A block 2002 constitutes a second booster circuit consisting of a level adjuster and an inverter and can supply a pulse signal whose amplitude is 5 volts. A block 2003 constitutes a third booster circuit whose input receives the output signal of block 2002 having an amplitude of 5 volts. The stages of the first block 2001 consist of condensers 2022 and diodes 2023 providing a boost of 1 volt per stage. The third block 2003 provides a boost of 4.5 volts even though there exists a forward voltage drop of 0.5V in each stage consisting of a condenser 2034 and a diode 2033. As can be seen from a comparison between FIGS. 27 and 28, the improvement shown in FIG. 28 can significantly decrease the number of circuit elements required for obtaining the same output voltage as the circuit shown in FIG. 27.

Within block 2001, which includes an inverter 2021, the capacitors 2022 of its five stages acquire charges $V'$ ... $5V'$. Block 2002 comprises a diode 2031, a capacitor 2032 and two MOSFETs 2025, 2026 as well as an inverter 2027. The capacitors 2034 of the six stages of block 2003 acquire charges $V''$ ... $6V''$.

Thus, the booster circuit shown in FIG. 27 makes use of 25 diodes in order to obtain 25V whereas the circuit shown in FIG. 8 makes use of 13 diodes and two MOSFETs in order to obtain $6V'' = 27V$ is about 4.5V.

In FIG. 29 we show a booster circuit according to the invention consisting of two booster circuits in cascade. The first booster circuit, represented by a block 3004, comprises MOSFETs 3035, 3036 as well as an inverter 3037 and delivers a pulsed output without power loss, the amplitude of that pulsed output being five times the amplitude V of its input pulses.

A block 3005 constitutes a second booster circuit of the conventional Cockcroft type, serving to raise a voltage $V''$ to $6V'' + 2V$. The circuit shown in FIG. 29 is capable of directly using the output from the block 300 as the input of the block 3005 so that a level-adjusting network such as the block 2002 of FIG. 28 is not required.

FIG. 30 shows a booster circuit according to the invention consisting of three booster circuits connected in cascade. A blcok 4006 constitutes a first booster circuit, a blcok 4007 constitutes a second booster circuit, and a block 4008 constitutes a third booster circuit. The block 4006 is identical with the block 3004 shown in FIG. 29, having no diode loss, except for the addition of two rectifier networks 4041 and 4042 supplying a direct current to the block 4007. If the input voltage is 1.5 volts, the block 4006 can supply a d-c output of +3 volts to a line 4043 and a d-c output of −1.5V to a line 4044, whereby a pulse signal of 4.5 volts amplitude with a maximum vlaue of −1.5V is generated on a line 4045. If this pulse signal is transmitted from the line 4045 to the input of block 4007, the latter produces two pulse signals of relatively inverted phase, having a potential difference of 13.5 volts which is three times the amplitude of the pulse signal on the line 4045, on lines 4046 and 4047 whereby a d-c pulse of −6 volts appears on a line 4048. The pulses on lines 4046 and 4047 energize the third block 4008, i.e. a Cockcroft circuit receiving a pulse signal with an amplitude of 13.5 volts at its input so that a boost of 13 volts per stage, each consisting of a condenser 4053 and a diode 4054, can be realized with allowance for a forward voltage drop of 0.5V caused by each diode. As a result, a pulse output of 26.0V is produced across lines 4047 and 4048. The circuit shown in FIG. 30 includes 15 MOSFETs 4055, 4056 and two inverters 4040, 4045, besides the two diodes 4045 which are the only circuit elements introducing a forward voltage drop.

By virtue of its large step-up ratio and low power loss, the booster circuit according to our invention is particularly suitable for use in an electronic wristwatch or the like operating with a low driving voltage and small power.

FIGS. 31, 32, 33, 34, 35, 36 and 37 show conventional Cockcroft-type booster circuits adapted to be used in our improved system wherein a semiconductive supply network, generating two pulse trains of relatively inverted phases, feeds respective inputs of the Cockcroft circuit.

In the booster circuit shown in FIG. 31A, if pulse signals 5005S and 5006S shown in FIG. 31B are applied to lines 5005 and 5006, respectively, at time $t_1$ the line 5005 has a voltage V while the line 5006 goes to O voltage so that a condenser C31 is charged through a diode D31 with a voltage V of the polarity indicated in FIG. 31A. At time $t_2$ the potential of line 5006 becomes V so that the potential of a line 5007 goes to 2V and the potential of line 5005 becomes 0 whereby a condenser C31' is charged through a diode D32 with a voltage 2V of the polarity indicated in FIG. 31A.

At time $t_1$ the voltage 5005S is V so that the potential of line 5008 becomes 3V and since the voltage 5006S is 0, a condenser C32 is charged through a diode D33 with a voltage 3V of the polarity indicated in FIG. 31A.

In an analogous manner, condensers C32' and C33 are charged through diodes D34 and D35 with respective voltages 2V and 5V of the polarities indicated in FIG. 31A.

The potential 5009S of a line 5009 varies in step with the signal 5006S and has its lower limit clamped to 5V, as shown in FIG. 31B. This potential is rectified by a diode 5035 whereby a rectifying condenser 5037 is charged with a voltage 6V of the polarity indicated in FIG. 31A to deliver a d-c output of +6V.

Figure 32:
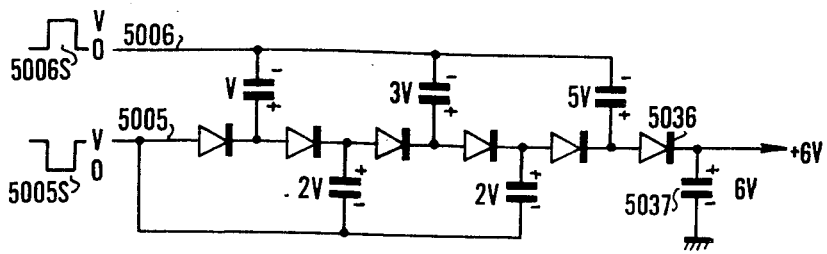
FIG. 32 is a diagram of an improved Cockcroft-type booster circuit according to our invention comprising parallel-connected condensers.
Figure 33:
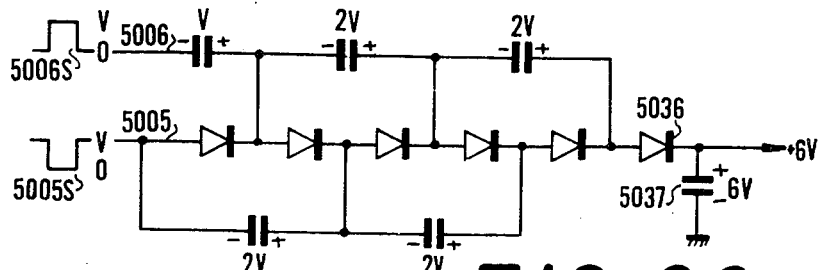
FIG. 33 is a diagram of an improved Cockcroft-type booster circuit according to our invention comprising series-connected condensers.

In FIG. 32 we show an embodiment in which all condensers of either circuit branch respectively connected to even-numbered and odd-numbered diode junctions are connected in parallel to input leads 5005 and 5006, respectively. FIG. 33 shows another embodiment in which all these condensers are connected in series. The parallel connection requires condensers of high breakdown voltage but provides a reduced output impedance, compared with a series connection.

Figure 34:
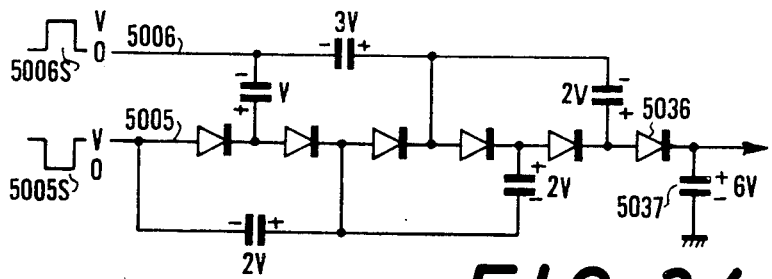
FIG. 34 is a diagram of an improved Cockcroft-type booster circuit according to our invention comprising series-parallel-connected condensers.

In FIG. 34 we show a further embodiment in which condensers connected to alternate diode junctions are connected in a series-parallel arrangement. If the number of condensers connected in parallel is increased, it is possible to lower the condenser charge. Thus, by modifying the number of condensers connected in series or in parallel we can vary the required breakdown voltage and the output impedance.

Figure 35:
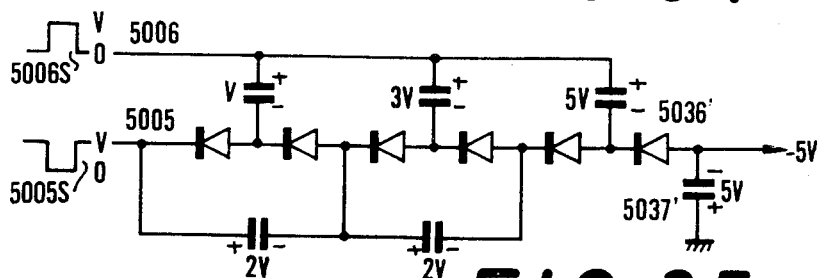
FIG. 35 is a diagram of an improved Cockcroft-type booster circuit according to our invention effective with a negative input pulse only.
Figure 36:
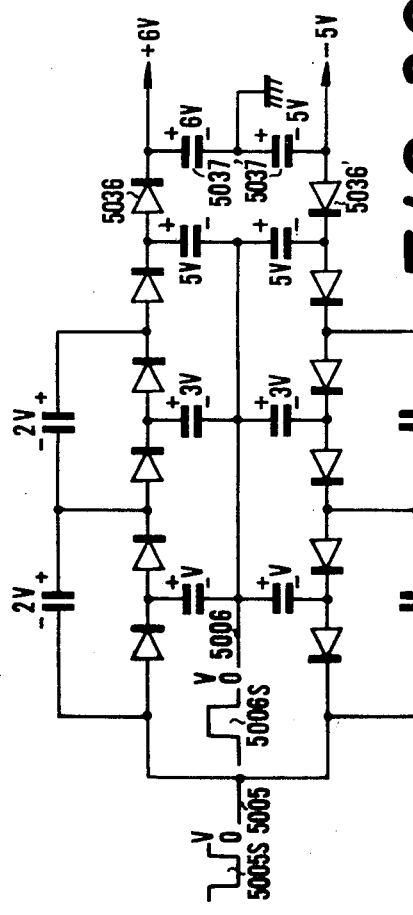
FIG. 36 is a diagram of an improved Cockcroft-type booster circuit according to our invention effective with both positive and negative input pulses.

In FIG. 35 there is shown an embodiment with a negative-going voltage step-up. FIG. 36 represents another embodiment with both positive-going and negative-going step-up.

In all of the embodiments of FIGS. 28 – 36 it has been assumed that the input signals were pulse trains with relatively inverted phases. The same mode of operation, however, is possible with pulse signals which are relatively phase-shifted in a different manner.

The above-described improvement has enabled us to achieve a boosting efficiency which is substantially twice that realized with conventional Cockcroft circuits having the same number of elements.

Figure 37:
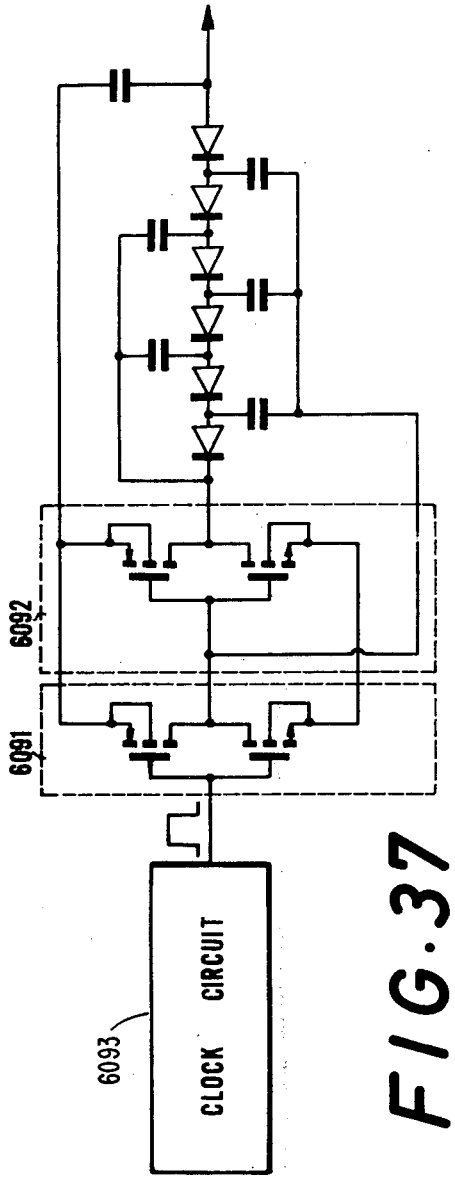
FIG. 37 is a diagram of a booster circuit according to the invention adapted to drive a prior-art Cockcroft circuit by means of complementary MOSFETs.

FIG. 37 shows an embodiment in which a complementary MOSFET circuit is used to drive such a prior-art Cockcroft booster circuit. In this embodiment, reference numerals 6091 and 6092 designate two MOSFET inverting stages. The use of our improved driving system substantially limits the power consumption to the saturation condition of the complementary MOSFETs and significantly decreases the power consumed under no-load condition. The booster circuit according to our invention can operate efficiently over a wide range of loads, thanks to a large mutual conductance. A clock circuit 6093 supplies the voltage wave which switches the MOSFETs in the way described above.

In addition, the present booster circuit is capable of delivering a d-c voltage which is substantially twice that obtained by prior-art Cockcroft-type booster circuits with the same number of elements.

What is claimed is:

1. In a voltage-boosting circuit, in combinations:
   input means for supplying a voltage wave alternating between a first and a second level;
   a field-effect transistor provided with a semi-conductive substrate, a source electrode connected directly to said substrate, a drain electrode coupled to said substrate through a P/N junction with a predetermined threshold voltage, said drain and source electrodes being located at opposite ends of a channel region of said substrate, and a gate controlling the conductivity of said channel region;
   circuit means connecting said source electrode to a point of fixed reference potential;
   a first lead extending from said input means to said drain electrode for delivering said voltage wave thereto;
   a series capacitor in said first lead; and
   a second lead extending from said input means to said gate for delivering said voltage wave thereto in inverted relationship with the voltage wave supplied to said drain electrode through said series capacitor, the relative polarities of the voltages at said drain electrode and said gate reversing during successive alternations of said voltage wave whereby said transistor is cut off during every other alternation and conducts in the intervening alternations with resulting equalization of the voltages of said drain and source electrodes.

2. The combination defined in claim 1 wherein said circuit means comprises a conductor carrying a constant voltage.

3. The combination defined in claim 1 wherein said circuit means comprises a condenser inserted between said source electrode and said point of fixed reference potential.

4. The combination defined in claim 3, further comprising a shunt diode inserted between said drain electrode and said point of fixed reference potential with a polarity opposite that of said P/N junction.

5. The combination defined in claim 4 wherein said shunt diode comprises a second field-effect transistor complementary to the first-mentioned transistor connected in parallel therewith.

6. The combination defined in claim 1 wherein said circuit means comprises an ancillary booster stage including a condenser in series with said second lead and a shunt diode connected between said gate and said source electrode in series-opposed relationship with said P/N junction.

7. In an electronic clockwork, in combination:
   input means for supplying a square-wave voltage;
   a field-effect transistor provided with a semiconductive substrate, a source electrode connected directly to said substrate, a drain electrode coupled to said substrate through a P/N junction with a predetermined threshold voltage, said drain and source electrodes being located at opposite ends of a channel region of said substrate, and a gate controlling the conductivity of said channel region;
   circuit means connecting said source electrode to a point of fixed reference potential;
   a first lead extending from said input means to said drain electrode for delivering said square-wave voltage thereto;
   a series capacitor in said first lead; and
   a second lead extending from said input means to said gate for delivering said square-wave voltage thereto in inverted relationship with the square-wave voltage supplied to said drain electrode through said series capacitor, the relative polarities of the voltages at said drain electrode and said gate reversing during successive alternations of said square-wave voltage whereby said transistor is cut off during every other alternation and conducts in the intervening alternations with resulting equalization of the voltages of said drain and source electrodes.

8. The combination defined in claim 7 wherein said circuit means comprises a condenser inserted between said source electrode and said point of fixed reference potential.

9. In a voltage-boosting circuit, in combination:
   input means for supplying a voltage wave alternating between a first and a second level;
   a pair of complementary field-effect transistors each provided with a semiconductive substrate, a source electrode connected directly to said substrate, a drain electrode coupled to said substrate through a P/N junction, said drain and source electrodes being located at opposite ends of a channel region of said substrate, and a gate controlling the conductivity of said channel region;
   first circuit means connecting the source electrode of each transistor to a point of fixed reference potential;
   capacitive second circuit means connecting said input means to the drain electrodes of both transistors for delivering said voltage wave thereto;
   third circuit means connecting said input means to the gates of both transistors for delivering said voltage wave thereto in inverted relationship with the voltage wave supplied to said drain electrodes by said second circuit means, the relative polarities of the voltages at the drain electrode and the gate of each transistor reversing during successive alternations of said voltage wave whereby each transistor is cut off during every other alternation and conducts in the intervening alternations with resulting equalization of the voltages of the drain and source electrodes thereof; and
   joint output means for said transistors producing a magnified replica of said voltage wave.

10. The combination defined in claim 9 wherein said circuit means comprises a condenser inserted between said source electrode and said point of fixed reference potential.

11. The combination defined in claim 9 wherein said output means includes a Cockcroft circuit with input terminals respectively connected to said drain electrodes.

12. In an electronic clockwork, in combination:
input means for supplying a square-wave voltage;
a pair of complementary field-effect transistors each provided with a semiconductive substrate, a source electrode connected directly to said substrate, a drain electrode coupled to said substrate through a P/N junction, said drain and source electrodes being located at opposite ends of a channel region of said substrate, and a gate controlling the conductivity of said channel region;
first circuit means connecting the source electrode of each transistor to a point of fixed reference potential;
capacitive second circuit means connecting said input means to the drain electrodes of both transistors for delivering said square-wave voltage thereto;
third circuit means connecting said input means to the gates of both transistors for delivering said square-wave voltage thereto in inverted relationship with the square-wave voltage supplied to said drain electrodes by said second circuit means, the relative polarities of the square-wave voltages at the drain electrode and the gate of each transistor reversing during successive alternations of said square-wave voltage whereby each transistor is cut off during every other alternation and conducts in the intervening alternations with resulting equalization of the voltages of the drain and source electrodes thereof; and
joint output means for said transistors producing a magnified replica of said square-wave voltage.

13. The combination defined in claim 12 wherein said circuit means comprises a condenser inserted between said source electrode and said point of fixed reference potential.

14. In a voltage-boosting circuit, in combination:
a chain of serially interconnected diodes forming junctions therebetween;
a first circuit branch with a first input and with a series of first capacitive networks connected between said first input and odd-numbered junctions of said diodes;
a second circuit branch with a second input and with a series of second capacitive networks connected between said second input and even-numbered junctions of said diodes;
semiconductive supply means for respectively applying two mutually dephased square waves to said inputs; and
an output capacitor connected between the last diode of said chain and a point of fixed reference potential, said last diode and said capacitor having a common load terminal whose potential relative to said reference potential varies with an amplitude substantially exceeding those of said square waves.

15. The combination defined in claim 14 wherein said supply means comprises a pair of complementary field-effect transistors.

16. In a voltage-boosting circuit, in combination:
two relatively inverted chains of serially interconnected diodes forming junctions therebetween;
a first circuit branch with a first input and with a series of first capacitive networks connected between said first input and odd-numbered junctions of each of said chains;
a second circuit branch with a second input and with a series of second capacitive networks connected between said second input and even-numbered junctions of each of said chains;
semiconductive supply means for respectively applying two mutually dephased square waves to said inputs; and
a pair of output capacitors respectively connected between the last diode of each chain and a point of fixed potential, said last diodes respectively defining with said capacitors a pair of load terminals whose relative potential varies with an amplitude substantially exceeding those of said square waves.

17. In an electronic clockwork, in combination:
a chain of serially interconnected diodes forming junctions therebetween;
a first circuit branch with a first input and with a series of first capacitive networks connected between said first input and odd-numbered junctions of said diodes;
a second circuit branch with a second input and with a series of second capacitive networks connected between said second input and even-numbered junctions of said diodes;
semiconductive supply means for respectively applying two mutually dephased square waves to said inputs; and
an output capacitor connected between the last diode of said chain and a point of fixed reference potential, said last diode and said capacitor having a common load terminal whose potential relative to said reference potential varies with an amplitude substantially exceeding those of said square waves.

18. The combination defined in claim 17 wherein said supply means comprises a pair of complementary field-effect transistors.

19. In an electronic clockwork, in combination:
two relatively inverted chains of serially interconnected diodes forming junctions therebetween;
a first circuit branch with a first input and with a series of first capacitive networks connected between said first input and odd-numbered junctions of each of said chains;
a second circuit branch with a second input and with a series of second capacitive networks connected between said second input and even-numbered junctions of each of said chains;
semiconductive supply means for respectively applying two mutually dephased square waves to said inputs; and
a pair of output capacitors respectively connected between the last diode of each chain and a point of fixed potential, said last diodes respectively defining with said capacitors a pair of load terminals whose relative potential varies with an amplitude substantially exceeding those of said square waves.

* * * * *